(12) United States Patent
Chen et al.

(10) Patent No.: US 11,018,070 B2
(45) Date of Patent: May 25, 2021

(54) SEMICONDUCTOR DIE, MANUFACTURING METHOD THEREOF, AND SEMICONDUCTOR PACKAGE

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,599

(22) Filed: Aug. 22, 2019

(65) Prior Publication Data

US 2021/0057303 A1 Feb. 25, 2021

(51) Int. Cl.
| | | |
|---|---|---|
| *H01L 23/31* | (2006.01) | |
| *H01L 23/528* | (2006.01) | |
| *H01L 21/66* | (2006.01) | |
| *H01L 25/065* | (2006.01) | |
| *H01L 21/56* | (2006.01) | |
| *H01L 21/02* | (2006.01) | |
| *H01L 21/48* | (2006.01) | |
| *H01L 23/00* | (2006.01) | |

(52) U.S. Cl.
CPC .... *H01L 23/3192* (2013.01); *H01L 21/02274* (2013.01); *H01L 21/486* (2013.01); *H01L 21/56* (2013.01); *H01L 22/32* (2013.01); *H01L 23/3171* (2013.01); *H01L 23/528* (2013.01); *H01L 24/08* (2013.01); *H01L 25/0657* (2013.01); *H01L 25/0652* (2013.01); *H01L 2224/08146* (2013.01)

(58) Field of Classification Search
CPC ............ H01L 25/0657; H01L 25/0652; H01L 23/3192; H01L 21/56; H01L 21/486; H01L 23/528; H01L 23/3171; H01L 24/08; H01L 24/05; H01L 2224/08147
See application file for complete search history.

(56) References Cited

U.S. PATENT DOCUMENTS

| | | |
|---|---|---|
| 8,846,548 B2 * | 9/2014 | Tu ........................ H01L 23/3192 438/780 |
| 8,993,380 B2 | 3/2015 | Hou et al. |
| | (Continued) | |

*Primary Examiner* — Jasmine J Clark
(74) *Attorney, Agent, or Firm* — JCIPRNET

(57) ABSTRACT

A semiconductor die is provided. The semiconductor die includes a semiconductor substrate, an interconnection structure, conductive pads, a first passivation layer, and a second passivation layer. The interconnection structure is disposed on the semiconductor substrate. The conductive pads are disposed over and electrically connected to the interconnection structure. The first passivation layer and the second passivation layer are sequentially stacked on the conductive pads. The first passivation layer and the second passivation layer fill a gap between two adjacent conductive pads. The first passivation layer includes a first section and a second section. The first section extends substantially parallel to a top surface of the interconnection structure. The second section faces a side surface of one of the conductive pads. Thicknesses of the first section and the second section are different.

20 Claims, 17 Drawing Sheets

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

* cited by examiner

SEMICONDUCTOR DIE, MANUFACTURING METHOD THEREOF, AND SEMICONDUCTOR PACKAGE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
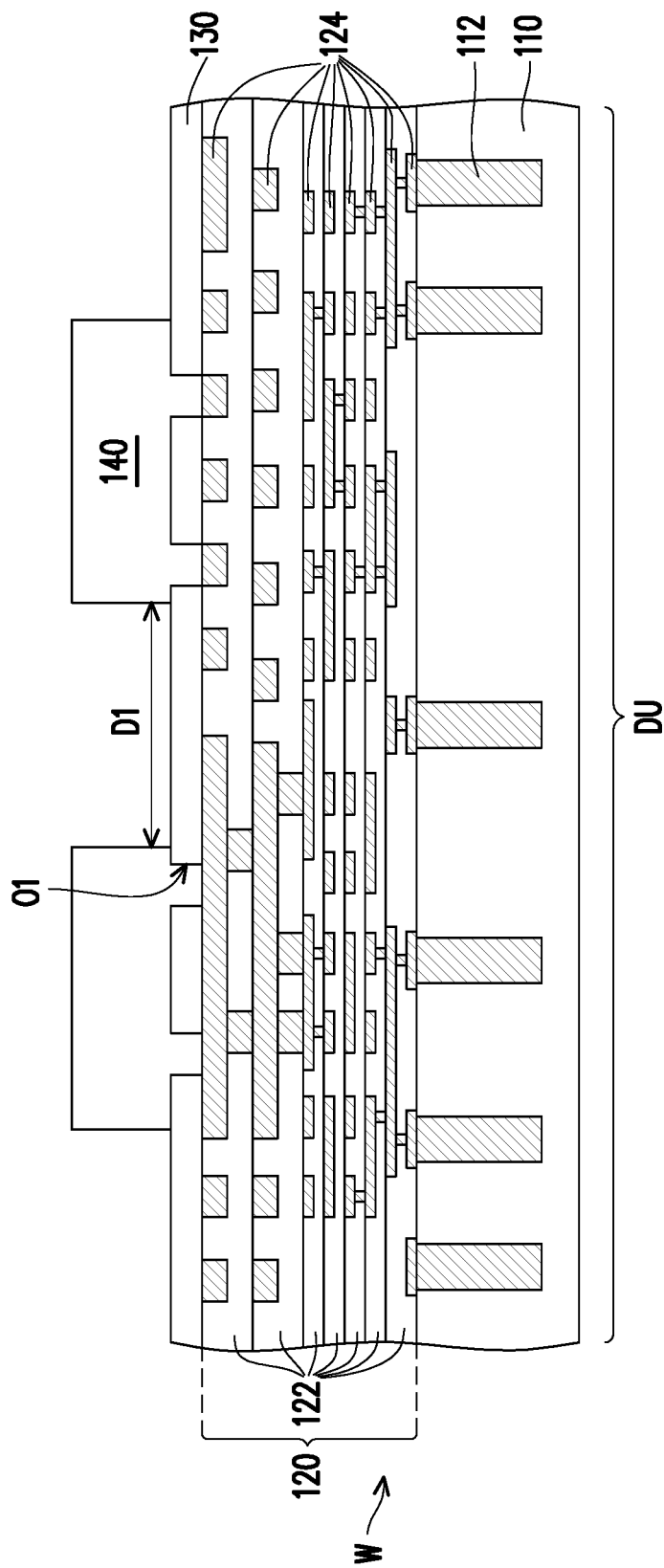
FIG. 1A to FIG. 1G are schematic cross-sectional views illustrating a manufacturing process of a semiconductor die in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating a manufacturing process of a semiconductor die 100 in accordance with some embodiments of the disclosure. Referring to FIG. 1A, a semiconductor wafer W is provided. In some embodiments, the semiconductor wafer W includes a plurality of die units DU. In some embodiments, each die unit DU corresponds to a portion of the semiconductor wafer W. In FIG. 1A, a single die unit DU is shown for simplicity. However, the disclosure is not limited thereto. Multiple die units DU may be arranged in an array in the semiconductor wafer W.

In some embodiments, each die unit DU includes a semiconductor substrate 110 and an interconnection structure 120 formed on the semiconductor substrate 110 In some embodiments, the semiconductor substrate 110 may be made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 110 includes active components (e.g., transistors or the like) and/or passive components (e.g., resistors, capacitors, inductors, or the like) formed therein. The semiconductor substrate 110 may further include a plurality of through semiconductor vias (TSV) 112 penetrating through the semiconductor substrate 110 for dual-side connection. However, the TSVs 112 are optional and may be omitted in some alternative embodiments.

As illustrated in FIG. 1A, the interconnection structure 120 is disposed on the semiconductor substrate 110. In some embodiments, the interconnection structure 120 includes inter-dielectric layers 122, and patterned conductive layers 124. In some embodiments, the patterned conductive layers 124 are embedded in the inter-dielectric layers 122. In some embodiments, the patterned conductive layers 124 and the inter-dielectric layers 122 are stacked alternately. In some embodiments, a portion of a patterned conductive layer 124 may extend through the underlying inter-dielectric layer 122 to establish electrical connection with the underlying patterned conductive layer 124. In some embodiments, the patterned conductive layer 124 may also establish electrical connection with the TSVs 112.

In some embodiments, a material of the inter-dielectric layers 122 includes polyimide, epoxy resin, acrylic resin, phenol resin, benzocyclobutene (BCB), polybenzoxazole (PBO), combinations thereof, or other suitable dielectric materials. The inter-dielectric layers 122 may be formed by suitable fabrication techniques such as spin-on coating, lamination, chemical vapor deposition (CVD), or the like. In some embodiments, a material of the patterned conductive layers 124 includes aluminum, titanium, copper, nickel, tungsten, and/or alloys thereof. The patterned conductive layers 124 may be formed by, for example, electroplating, deposition, and/or photolithography and etching. In some embodiments, the interconnection structure 120 is formed by sequential CVD and dual damascene processes. It should be noted that the number of patterned conductive layers 124 and inter-dielectric layers 122 shown in FIG. 1A is merely an illustration, and the disclosure is not limited thereto. In some alternative embodiments, the number of the patterned conductive layers 124 and the number of the first inter-dielectric layers 122 may be adjusted depending on the routing requirements.

In some embodiments, a protective layer 130 is formed over the interconnection structure 120. In some embodiments, the protective layer 130 may blanketly cover the interconnection structure 120. The protective layer 130 may further include openings O1 exposing portions of the topmost patterned conductive layer 124. In some embodiments, a material of the protective layer 130 includes oxides, such as silicon oxide, nitrides, such as silicon nitrides or the like. In some embodiments, the protective layer 130 may include polyimide, epoxy resin, acrylic resin, phenol resin, benzocyclobutene (BCB), polybenzoxazole (PBO), or any other suitable dielectric material. The protective layer 130, for example, may be formed by suitable fabrication techniques such as spin-on coating, CVD, or the like. In some embodiments, the interconnection structure 120 is sandwiched between the protective layer 130 and the semiconductor substrate 110.

In some embodiments, conductive pads 140 are disposed over the protective layer 130. In some embodiments, the conductive pads 140 fill the openings O1 of the protective layer 130 and reach the topmost patterned conductive layer 124 to establish electrical connection. In some embodiments, portions of the protective layer 130 are disposed between portions of the conductive pads 140 and the interconnection structure 120, whilst portions of the conductive pads 140 penetrates through the protective layer 130 to connect with the topmost patterned conductive layer 124. In some embodiments, the conductive pads 140 are used to establish electrical connection with other components (not shown) or dies (not shown) subsequently formed or provided. In some alternative embodiments, the conductive pads 140 may be test pads used to probe the die units DU in which the conductive pads 140 are included.

Figure 1B:
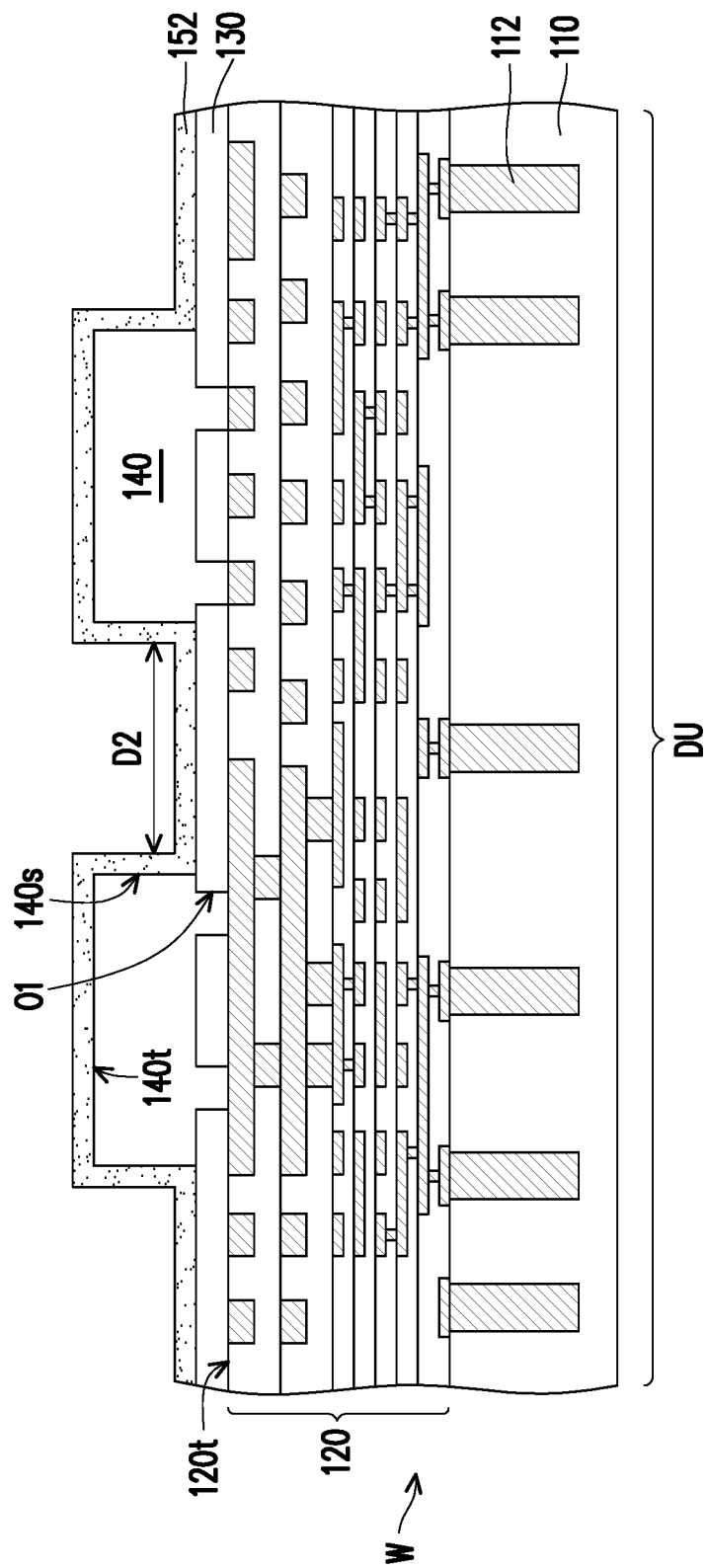

Referring to FIG. 1B, a first passivation layer 152 is formed over the conductive pads 140 and the protective layer 130. In some embodiments, the first passivation layer 152 is conformally disposed over the conductive pads 140 and the protective layer 130. In some embodiments, the first passivation layer 152 may cover the conductive pads 140 and the protective layer 130. In some embodiments, a thickness of the first passivation layer 152 is in the range between 0.1 micrometers to 1 micrometer. In some embodiments, a material of the first passivation layer 152 includes oxides. In some embodiments, a material of the first passivation layer 152 includes silicon oxide. In some embodiments, the first passivation layer 152 is formed by a chemical vapor deposition other than high-density plasma chemical vapor deposition. In some embodiments, a temperature in the range from 300° C. to 450° C. is used during formation of the first passivation layer 152.

Figure 1C:
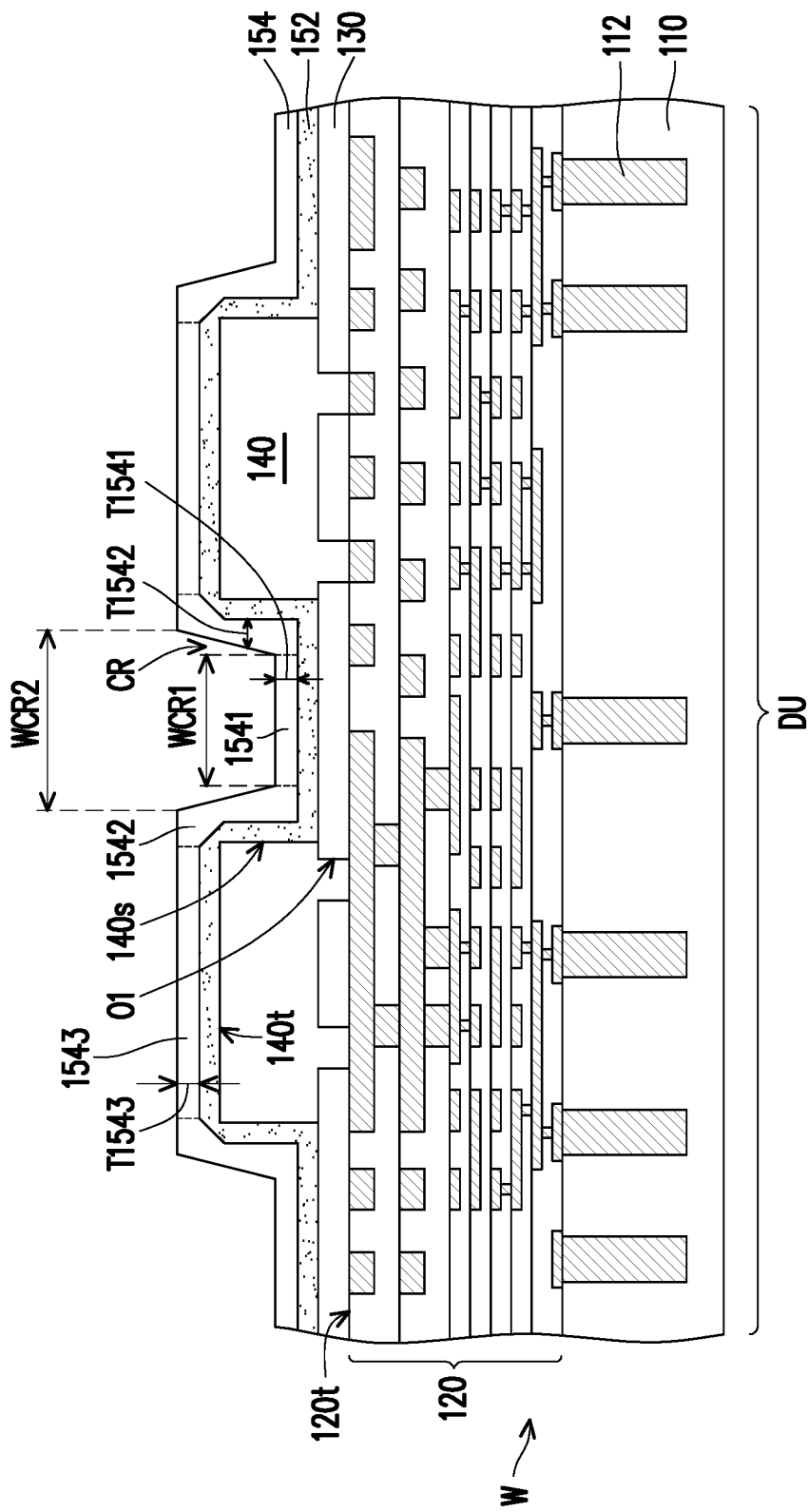

Referring to FIG. 1C, a second passivation layer 154 is formed over the first passivation layer 152 to cover the first passivation layer 152. In some embodiments, a thickness of the second passivation layer 154 may be in the range from 0.1 micrometers to 2 micrometers. In some embodiments, the second passivation layer 154 includes sections 1541-1543 connected to each other. In some embodiments, sections 1541-1543 of the second passivation layer 154 may have different thicknesses. For example, the section 1541 of the passivation layer 154 extending parallel to the top surface 120*t* of the interconnection structure 120 but not over the conductive pads 140 may be thinner than the sections 1542 facing the side surfaces 140S of the conductive pads 140 (covering the side surfaces 140S of the conductive pads 140). Furthermore, a thickness T1541 of the section 1541 and a thickness T1542 of the sections 1542 may be different from a thickness T1543 of the section 1543 extending over the top surfaces 140*t* of the conductive pads 140. In some embodiments, the thicknesses T1541-T1543 of the sections 1541-1543 are measured as the distance between the surface of the second passivation layer 154 in contact with the first passivation layer 152 and the directly opposing surface. In some embodiments, the sections 1542 covering the side surfaces 140S may be inclined with respect to the side surfaces 140S of the conductive pads 140. In some embodiments, the sections 1542 and the section 1541 of the passivation layer 154 may define a concave region CR between two adjacent conductive pads 140. In some embodiments, the concave region CR may have the profile of a truncated cone or pyramid with a regular or irregular base. That is, a width of the concave region CR may increase (the concave region CR becomes increasingly broader) proceeding further away from the passivation layer 130. For any level height (vertical distance from the interconnection structure 120), the width of the concave region CR may be considered as the horizontal distance between outer surfaces of sections 1542 forming the concave region CR. Two widths WCR1 and WCR2 of the concave region CR at two different level heights are indicated in FIG. 1C for illustration purposes. In some embodiments, extending directions of two sections 1542 forming the same concave region CR may converge towards the top surface 120*t* of the interconnection structure 120. In some embodiments, a material of the second passivation layer 154 may be the same as a material of the first passivation layer 152. In some embodiments, the first passivation layer 152 and the second passivation layer 154 may be made of silicon oxide. In some embodiments, the second passivation layer 154 may be formed by high-density plasma chemical vapor deposition (HDP-CVD). During the HDP-CVD process, deposition of a new material may be in competition with etching of previously loosely deposited material. In some embodiments, it is possible that the loosely deposited material may be sputtered off by reactive ions or radicals formed during the HDP-CVD process. In some embodiments, a competition between the deposition of the new material and the etching of the loosely deposited materials may result in different thickness of different sections 1541-1543 of the second passivation layer 154 as described above. In some embodiments, as shown in FIG. 1C, portions of the first passivation layer 152 may also be removed. For example, portions of the first passivation layer 152 may be removed such that the edges of the first passivation layer 152 may be smoothed during the formation of the second passivation layer 154. In some embodiments, the HDP-CVD process may be conducted at a temperature in the range from 300° C. to 450° C.

Figure 1D:
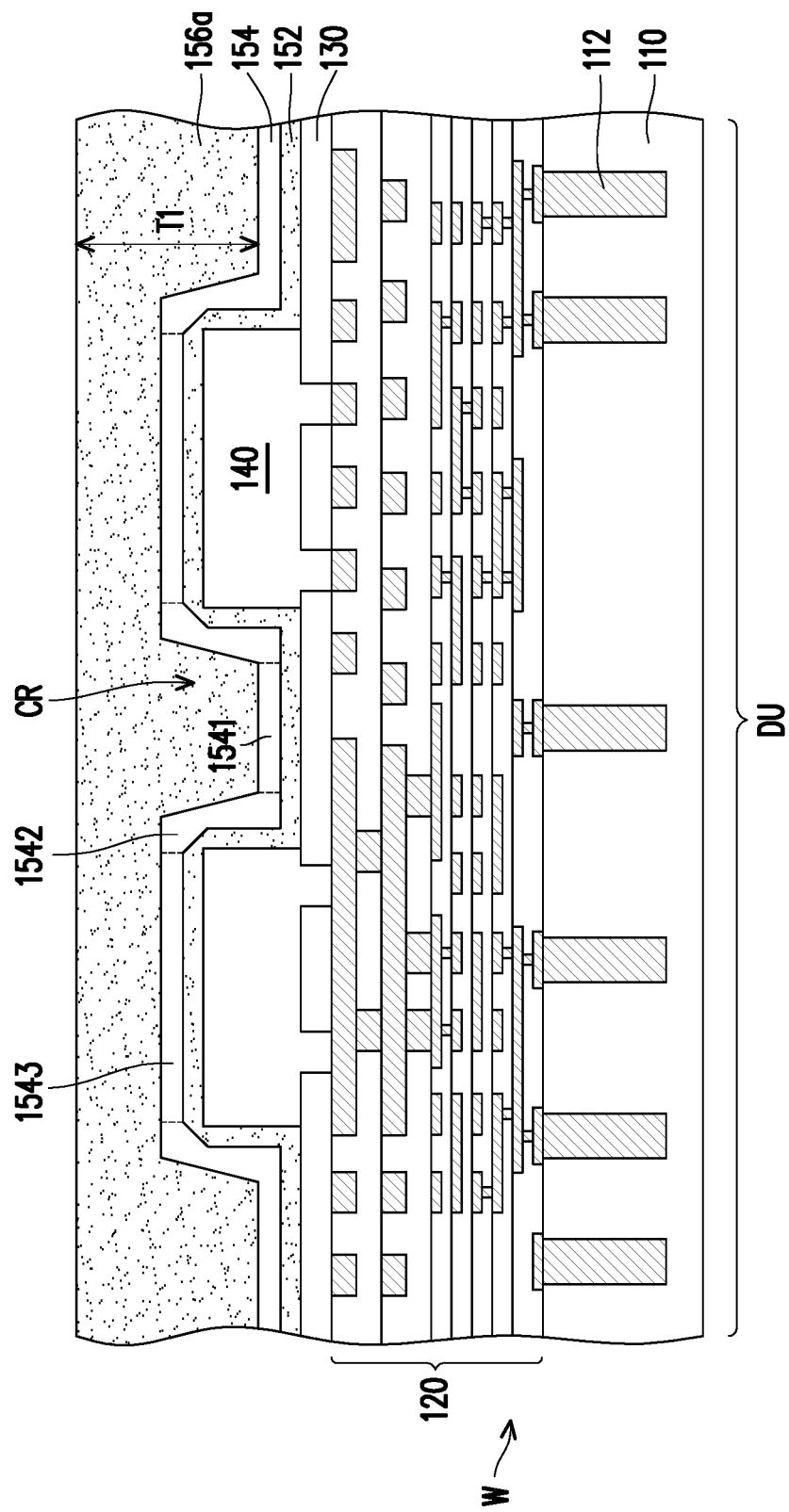

Referring to FIG. 1D, a third passivation precursor layer 156*a* may be formed over the second passivation layer 154. In some embodiments, a material of the third passivation precursor layer 156a may be the same as the material of the second passivation layer 154. In some embodiments, the third passivation precursor layer 156a covers the second passivation layer 154. In some embodiments, the third passivation precursor layer 156a extends over the conductive pads 140 and fills the concave region CR. In some embodiments, with the aid of the second passivation layer 154, no gaps (vacuum sacks) is formed in the concave region CR during formation of the third passivation precursor layer 156a. That is, the concave region CR is completely filled by the third passivation precursor layer 156a. In some embodiments, a material of the third passivation precursor layer 156a may be different from a material of the first passivation layer 152. In some alternative embodiments, the material of the third passivation precursor layer 156a may be the same as the material of the first passivation layer 152. In some embodiments, the material of the third passivation precursor layer 156a includes silicon oxide. In some embodiments, the third passivation precursor layer 156a may be formed by CVD, or the like. In some embodiments, the third passivation precursor layer 156a is formed to have a thickness T1.

Figure 1E:
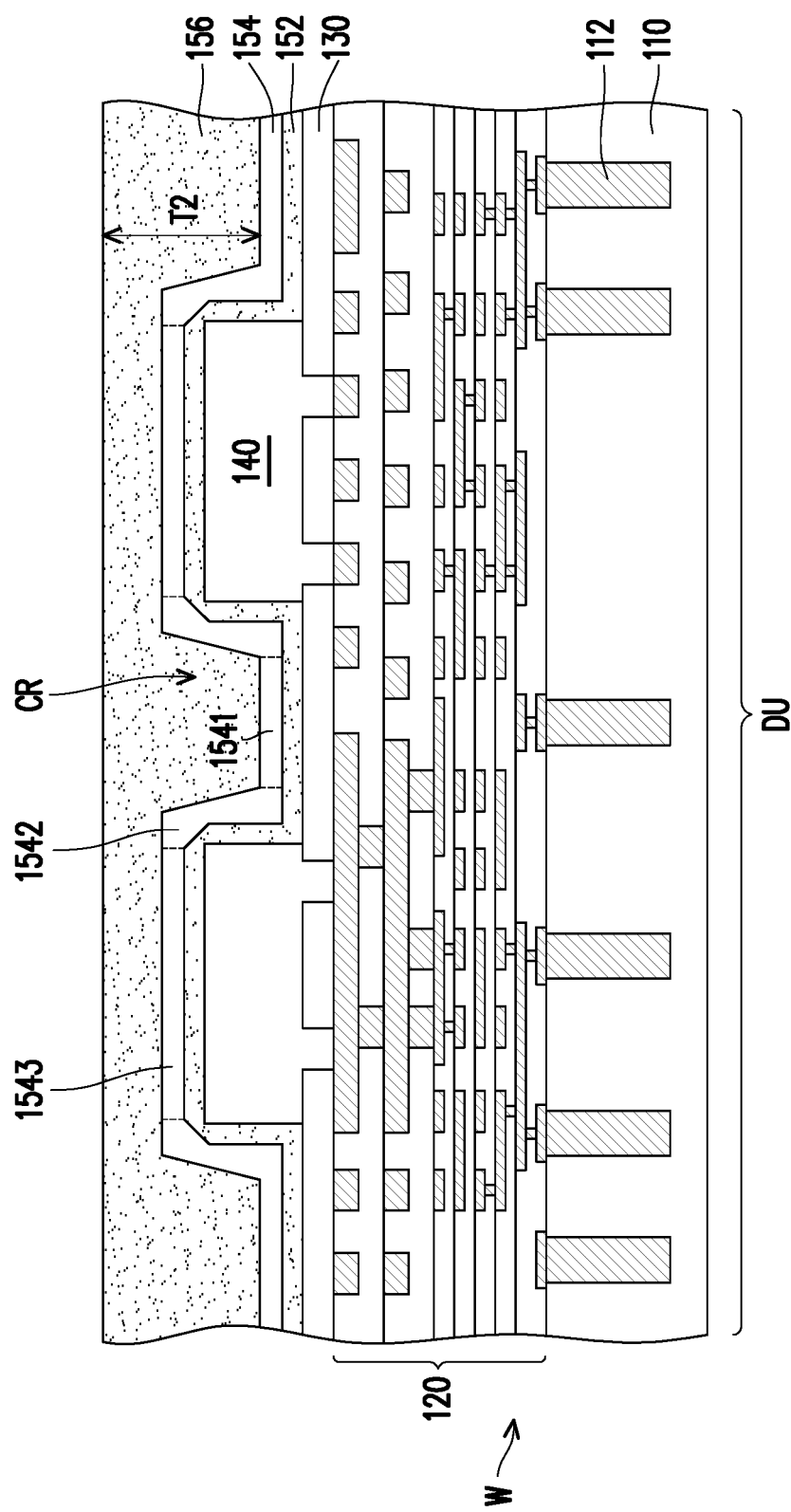

Referring to FIG. 1D and FIG. 1E, a third passivation layer 156 is formed from the third passivation precursor layer 156a. In some embodiments, the thickness T1 of the third passivation precursor layer 156a is reduced to a thickness T2 of the third passivation layer 156 by, for example, a planarization process. In some embodiments, the planarization process includes a mechanical grinding process, a chemical mechanical polishing (CMP) process, or the like. In some embodiments, the thickness T2 of the third passivation layer 156 is about one half of the thickness T1 of the third passivation precursor layer 156a. As illustrated in the process above, stacked passivation layers 152, 154, 156 are formed by alternating high-density plasma chemical vapor deposition processes (e.g., for the formation of the second passivation layer 154) with chemical vapor deposition processes other than high-density plasma chemical vapor deposition processes (e.g., for the formation of the first and third passivation layers 152, 156). In some embodiments, more or fewer passivation layers than the ones illustrated in FIG. 1E may be included. In some embodiments, passivation layers formed with HDP-CVD are alternately stacked with passivation layers formed with other deposition techniques than HDP-CVD (e.g., other CVD techniques excluding HDP-CVD).

Figure 1F:
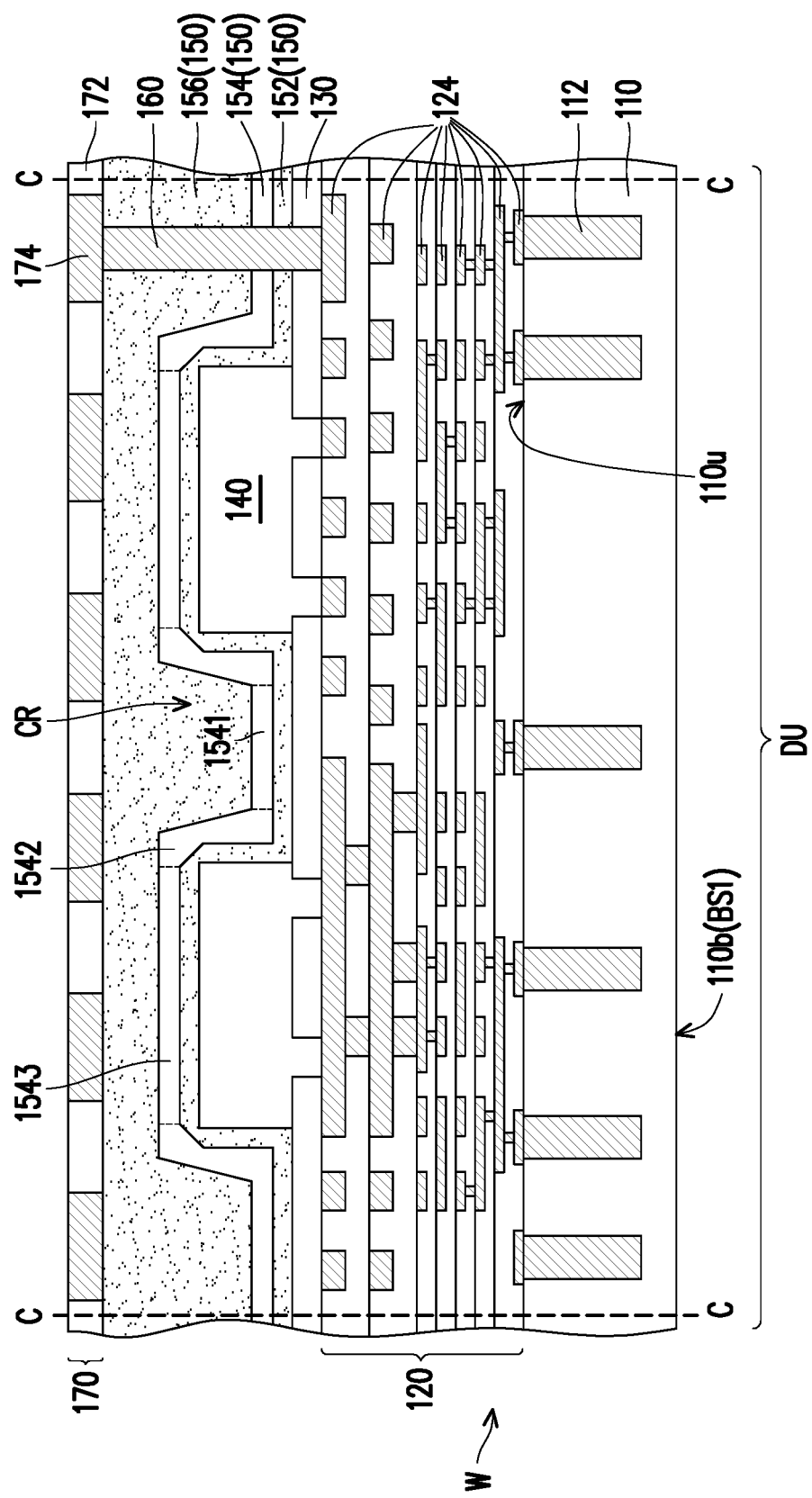

Referring to FIG. 1F, bonding vias 160 and a bonding layer 170 are formed. The bonding vias 160 penetrate through the passivation layers 152, 154, and 156 to establish electrical connection with the patterned conductive layers 124 of the interconnection structure 120. In some embodiments, although not shown in FIG. 1F, some of the bonding vias 160 may be disposed on the conductive pads 140. The bonding layer 170 is disposed on the third passivation layer 156 and the bonding vias 160. In some embodiments, the bonding layer 170 includes a dielectric bonding layer 172 and bonding pads 174 interspersed in the dielectric bonding layer 172. In some embodiments, at least some of the bonding pads 174 are disposed over the bonding vias 160, and are electrically connected to the interconnection structure 120 via the bonding vias 160.

A method of producing the bonding vias 160 and the bonding layer 170 is not particularly limited. In some embodiments, the bonding vias 160 and the bonding pads 174 may be formed via a dual damascene process. For example, the dielectric bonding layer 172 may be formed on the third passivation layer 156, trenches and via holes (not shown) may be opened (not necessarily in the recited order) by removing portions of the dielectric bonding layer 172, the passivation layers 152, 154, 156, and the protective layer 130, and a conductive material (not shown) may be disposed in the trenches and via holes to form the bonding pads 174 and the bonding vias 160, respectively. In some embodiments, the bonding vias 160 and the bonding pads 174 are formed by simultaneously filling via holes and overlying trenches (not shown), to which the via holes are connected. In some alternative embodiments, the bonding vias 160 may be formed before the dielectric bonding layer 172. In some embodiments, a width of a bonding pad 174 may be greater than a width of the underlying bonding via 160. In some embodiments, the bonding vias 160 and the bonding pads 174 include the same material. Materials for the bonding vias 160 and the bonding pads 174 are, for example, aluminum, titanium, copper, nickel, tungsten, or alloys thereof.

Figure 1G:
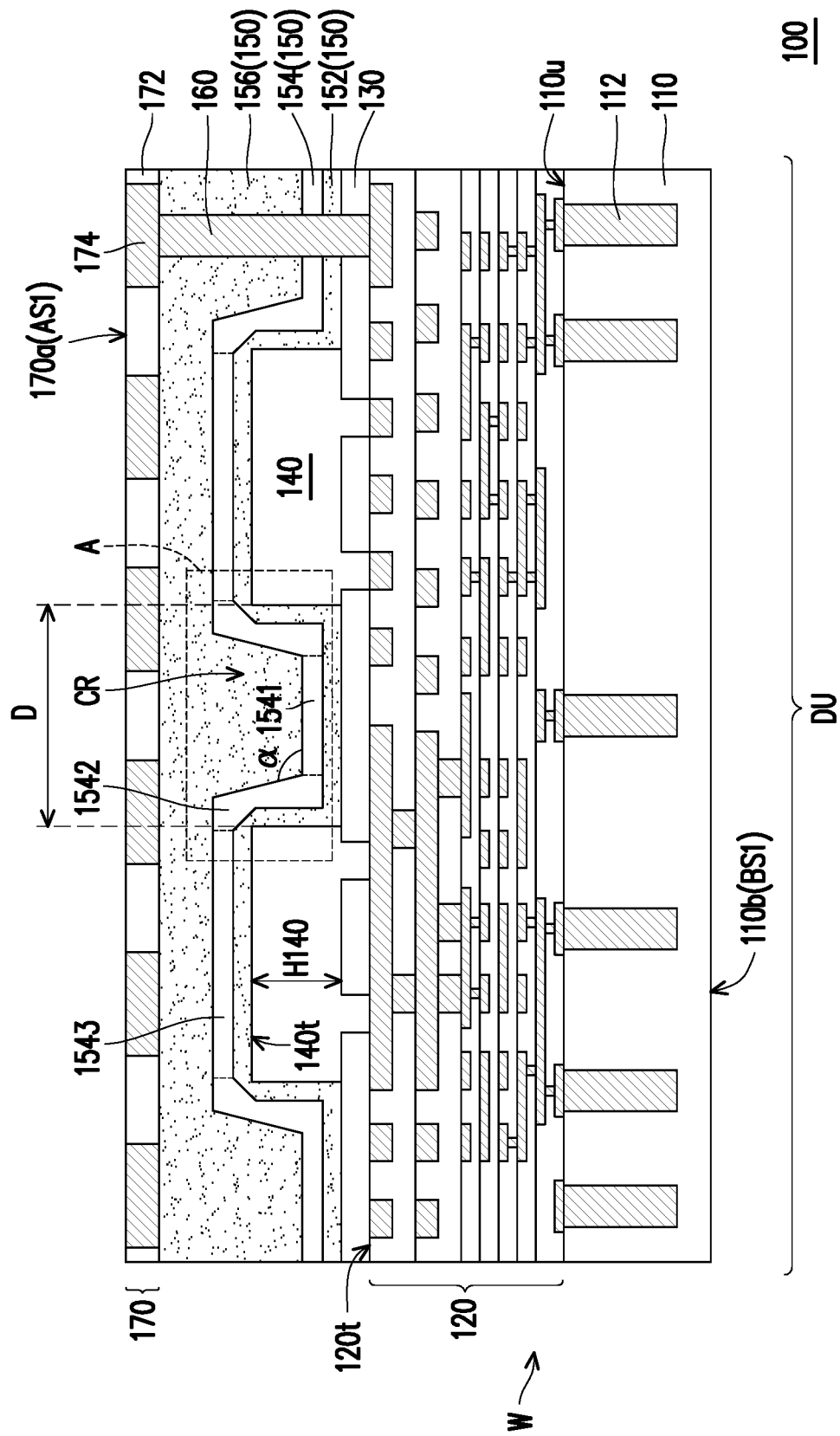

Referring to FIG. 1F and FIG. 1G, a singulation step is performed to separate the individual semiconductor dies 100, for example, by cutting through the semiconductor wafer W along the cutting lines C-C arranged between individual die units DU. In some embodiments, the singulation process typically involves performing a wafer dicing process with a rotating blade and/or a laser beam. Following singulation, individual semiconductor dies 100 may be produced from the semiconductor wafer W.

As illustrated in FIG. 1G, the semiconductor die 100 includes the semiconductor substrate 110, the interconnection structure 120, one or more conductive pads 140, the passivation layers 152, 154, 156, and the bonding layer 170. In some embodiments, TSVs 112 are formed within the semiconductor substrate 110. The protective layer 130 is disposed over the interconnection structure 120, and the conductive pads 140 is disposed over the protective layer 130. The conductive pads 140 are directly in contact with the interconnection structure 120 to establish electrical connection. The bonding layer 170 is disposed over the third passivation layer 156 and includes a dielectric bonding layer 172 and bonding pads 174. At least some of the bonding pads 174 are electrically connected to the interconnection structure 120 or the conductive pads 140 by the bonding vias 160. The bonding vias 160, which extends from the bonding layer 170 to the conductive pads 140 or the interconnection structure 120, penetrate through the passivation layers 152, 154, 156 and, possibly, the protective layer 130. In some embodiments, a surface 170a of the bonding layer 170 further away from the third passivation layer 156 may be referred to as an active surface AS1 of the semiconductor die 100. As shown in FIG. 1G, the top surfaces of the bonding pads 174 and the top surface of the dielectric bonding layer 172 are substantially located at the same level height to provide an appropriate active surface AS1 for hybrid bonding. In some embodiments, a surface 110b of the semiconductor substrate 110 opposite to the interconnection structure 120 may be referred to as a backside surface BS1 of the semiconductor wafer W.

The first passivation layer 152 is conformally disposed over the protective layer 130 to cover the conductive pads 140. Corners of the first passivation layer 152 may be smoothed as a result of the formation of the second passivation layer 154. The second passivation layer 154 is disposed over the first passivation layer 152. The second passivation layer 154 includes sections 1541, 1542, 1543 having different thicknesses. The sections 1542 and the intervening section 1541 joining the two facing sections 1542 form a concave region CR in between the two conductive pads 140. In some embodiments, each of the sections 1542 may be inclined at an angle α measured with an extending direction of the section 1541. That is, the inclination angle α may be considered as an included angle between the section 1541 and one of the sections 1542 joined to the first section 1541. In some embodiments, the inclination angle α may be measured between an outer surface of the section 1542 and an outer surface of the first section 1541, and may be referred as an included angle. In some embodiments, the outer surface of the section 1542 (the surface facing away from the conductive pads 140) may be substantially straight (has a substantially constant slope until the section 1542 reaches a level height of the section 1543 extending on the top surface 140*t* of the conductive pad 140). In the embodiments in which the outer surface of the section 1542 is substantially straight, the inclination angle α may be measured anywhere along the section 1542. However, the disclosure is not limited thereto. In some alternative embodiments, the slope of the outer surface of the section 1542 may vary, in which the inclination angle α is measured between a line tangent to the outer surface of the section 1542 at the joint with the section 1541. In some embodiments, the inclination angle α of the sections 1542 may independently be in the range from 100° to 120°. Furthermore, the inclination angles α of the two sections 1542 forming the same concave region CR may be the same, but the disclosure is not limited thereto. In some alternative embodiments, the inclination angles α of two sections 1542 forming the same concave region CR are different. In some embodiments, each concave region CR broadens moving away from the interconnection structure 120. That is, the outer surfaces of two sections 1542 forming the given concave region CR converge towards the interconnection structure 120 and diverge towards the bonding layer 170. In some embodiments, the shape, the thickness, and the overall profile of the second passivation layer 154 may be determined by the process parameter when conducting the HDP-CVP process to form the second passivation layer 154.

The third passivation layer 156 is disposed over the second passivation layer 154, the interconnection structure 120, and the conductive pads 140. In some embodiments, the third passivation layer 156 fills the concave region CR. In some embodiments, the profile of the concave region CR facilitates gapless formation of the third passivation layer 156. That is, because of the profile obtained for the second passivation layer 154 during the HDP-CVD process, subsequent deposition of the third passivation layer 156 may be free from defects. For examples, a number of vacuum gaps formed in the third passivation layer 156 may be reduced or eliminated with respect to the case in which the second passivation layer 154 is not included or, in some embodiments, is not formed with an HDP-CVD process. Satisfactory gap filling capability can be achieved even when an aspect ratio D/H140 of the distance D separating opposite side surfaces 140S of two adjacent conductive pads to the height H140 of the conductive pads 140 above the protective layer 130 is less than 3. In some embodiments, the height H140 of the conductive pad 140 is measured as the distance between the top surface 140*t* of the conductive pad 140 and the top surface of the protective layer 130. In some embodiments, two adjacent conductive pads 140 may have different heights. Under this scenario, the greater of the two measured heights is taken as the height H140 to determine the aspect ratio of the intervening concave region CR. In some embodiments, good filling capability can be achieved for an aspect ratio D/H140 as low as 0.65. In other words, with the aid of the second passivation layer 156, the top surface of the third passivation layer 156 may be a substantially flat surface.

Therefore, the bonding layer 170 may be formed on a flat surface, thereby eliminating the possibility of trace/pad breakage in the bonding layer 170. As such, inclusion of the second passivation layer 154 formed with an HDP-CVD process results in increased reliability and reduced failure rate for the semiconductor dies 100, thus enhancing the yield of the manufacturing process and reducing the unitary production cost. In some embodiments, the stacked passivation layers 152, 154, 156 may be collectively referred to as a composite passivation structure 150.

Figure 2:
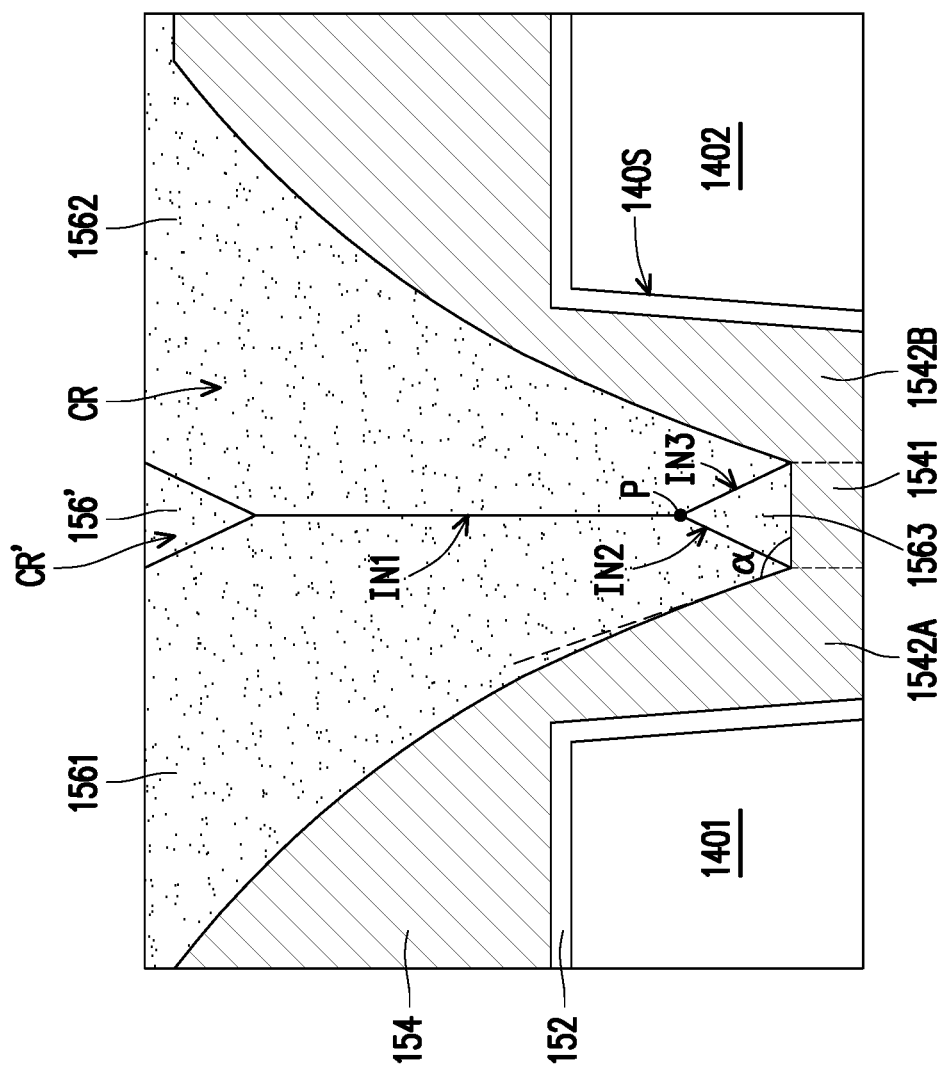
FIG. 2 is a schematic enlarged view of a region of the semiconductor die in FIG. 1G.

FIG. 2 is a schematic enlarged view of a region A of the semiconductor die 100 in FIG. 1G. It should be noted that in FIG. 2, different reference numerals are used for similar elements for ease of reference (e.g., conductive pads 1401 and 1402), without necessarily implying distinction between the referred parts. As illustrated in FIG. 2, the conductive pads 1401 and 1402 may be coated by the first passivation layer 152. The first passivation layer 152 is disposed in a substantially conformal manner over the conductive pads 1401 and 1402. The second passivation layer 154 covers the first passivation layer 152. A concave region CR is formed between adjacent conductive pads 1401 and 1402. As shown in FIG. 2, in some embodiments, the slope of the sections 1542A and 1542B of the second passivation layer 154 may change. That is, the sections 1542A and 1542B may have a curved profile, rather than a straight profile. As a result, the interface between the sections 1542A and 1542B of the second passivation layer 154 and the third passivation layer 156 formed on the second passivation layer 154 may be curved. As illustrated in FIG. 2, the section 1542A extends over the conductive pad 1401, the section 1542B extends over the conductive pad 1402, and the sections 1542A and 1542B may be connected by the section 1541 of the second passivation layer 1542.

The third passivation layer 156 is disposed on the second passivation layer 154. In some embodiments, as illustrated in FIG. 2, the third passivation layer 156 may include multiple portions 1561, 1562, 1563. For example, the first portion 1561 is deposited over the section 1542A of the second passivation layer 154, the second portion 1562 is deposited over the section 1542B of the second passivation layer 154, and the third portion 1563 is deposited over the section 1541 of the second passivation layer 154. Each of the portions 1561 and 1562 may grow from the surface of the corresponding underlying sections 1542A or 1542B. The portion 1561 and the portion 1562 may encounter at an interface IN1. The portions 1561 and 1562 may encounter to form a shallower concave region CR' which may be filled by one or more additional passivation layers or portions thereof (e.g., portion 156' in FIG. 2).

In some embodiments, the third portion 1563 may have a substantially triangular shape pointing away from the interconnection structure 120, with a base disposed on the section 1541. In some embodiments, the third portion 1563 has an interface IN2 with the first portion 1561 and an interface IN3 with the second portion 1561. In some embodiments, the three interfaces IN1, IN2, and IN3 encounters at a same point P. In some embodiments, the shape of the portions 1561, 1562, 1563 is determined by the profile of the second passivation layer 154 and the conditions used for the formation of the third passivation layer 156. It should be noted that the configuration shown in FIG. 2 is merely an illustration. In some alternative embodiments, the interfaces IN1, IN2, and IN3 may not be visible.

Figure 3A:
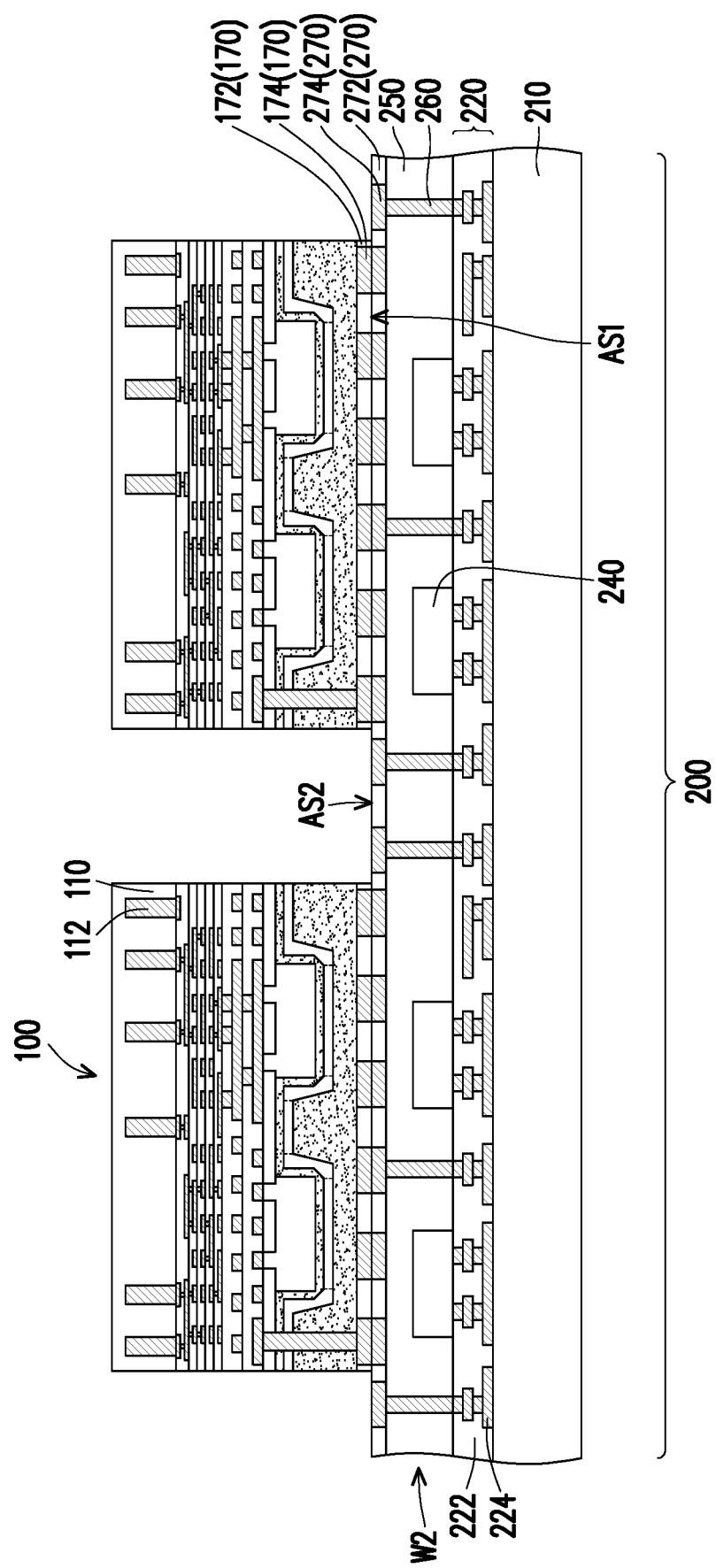
FIG. 3A to FIG. 3E are schematic cross-sectional views illustrating a manufacturing process of a semiconductor package in accordance with some embodiments of the disclosure.

FIG. 3A to FIG. 3E are schematic cross-sectional views illustrating a manufacturing process of a semiconductor package 10 in accordance with some embodiments of the disclosure. Referring to FIG. 3A, a semiconductor wafer W2 is provided. The semiconductor wafer W2 may include one or more semiconductor dies 200 formed therein, corresponding to different portions of the semiconductor wafer W2. The semiconductor wafer W2 and the semiconductor dies 200 may be respectively similar to the semiconductor wafer W and the semiconductor dies 100 described above, so the detailed description thereof is omitted herein. In some embodiments, each semiconductor die 200 includes a semiconductor substrate 210, an interconnect structure 220, conductive pads 240, a passivation layer 250, bonding vias 260 and a bonding layer 270. The bonding layer 270 includes a dielectric bonding layer 272 and bonding pads 274. In some embodiments, the passivation layer 250 may be a composite passivation structure which is similar to the composite passivation structure 150 of the semiconductor die 100. As illustrated in FIG. 3A, top surfaces of the dielectric bonding layer 272 and the bonding pads 274 may be collectively referred to as an active surface AS2 of the semiconductor die 200. As shown in FIG. 3A, the top surface of the dielectric bonding layer 272 and the top surfaces of the bonding pads 274 are substantially located at the same level height to provide an appropriate active surface AS2 for hybrid bonding.

Referring to FIG. 3A, semiconductor dies (upper dies) 100 are provided on the active surfaces AS2 of the semiconductor dies 200. In some embodiments, multiple semiconductor dies 100 are disposed on a single semiconductor die 200. The semiconductor dies 100 disposed on a same semiconductor die 200 may be of the same type or perform the same function, but the disclosure is not limited thereto. In some alternative embodiments, the semiconductor dies 100 disposed on a same semiconductor die 200 may be different from each other, or perform different functions.

In some embodiments, the semiconductor dies 100 may be dies capable of performing storage function. For example, each of the semiconductor dies 100 may independently be a Dynamic Random Access Memory (DRAM), a Resistive Random Access Memory (RRAM), a Static Random Access Memory (SRAM), or the like. However, the disclosure is not limited thereto. In some alternative embodiments, one or more of the semiconductor dies 100 may independently be a Central Process Unit (CPU) dies, a Graphic Process Unit (GPU) dies, a Field-Programmable Gate Array (FPGA), or the like.

As illustrated in FIG. 3A, the semiconductor dies 100 are bonded to the semiconductor dies 200. In some embodiments, the semiconductor dies 100 may be bonded to the semiconductor dies 200 through a hybrid bonding process. In some embodiments, a temperature of the hybrid bonding process ranges from about 200° C. to about 300° C. In some embodiments, the semiconductor dies 100 may be picked-and-placed onto the active surfaces AS2 of the semiconductor dies 200 such that the semiconductor dies 100 are electrically connected to the semiconductor dies 200. In some embodiments, the semiconductor dies 100 are placed such that the active surfaces AS1 of the semiconductor dies 100 are in contact with the active surfaces AS2 of the semiconductor dies 200. Furthermore, the bonding pads 174 of the semiconductor dies 100 are substantially aligned and in direct contact with the corresponding bonding pads 274 of the semiconductor dies 200. For example, the dielectric bonding layer 172 is directly in contact with the dielectric bonding layer 272, and the bonding pads 174 are directly in contact with the bonding pads 274. In some embodiments, the semiconductor dies 100 cover only some of the bonding pads 274. That is, even after placements of the semiconductor dies 100, some bonding pads 274 may be left exposed. In some embodiments, to facilitate the hybrid bonding between the semiconductor dies 100 and the semiconductor dies 200, surface preparation for the bonding surfaces (i.e. the active surfaces AS1 and the active surfaces AS2) of the semiconductor dies 100 and the semiconductor wafer W2 may be performed. The surface preparation may include surface cleaning and activation, for example. Surface cleaning may be performed on the active surfaces AS1, AS2 to remove particles on the bonding surfaces of the bonding pads 174 and 274 and the bonding surfaces of the dielectric bonding layers 172 and 272. In some embodiments, the active surfaces AS1, AS2 may be cleaned by wet cleaning, for example.

After cleaning the active surfaces AS1 and AS2, activation of the bonding surfaces of the dielectric bonding layers 172 and 272 may be performed for development of high bonding strength. For example, plasma activation may be performed to treat the bonding surfaces of the dielectric bonding layers 172 and 272. When the activated bonding surfaces of the dielectric bonding layers 172 and 272 are in contact with each other, the dielectric bonding layers 172 and 272 are pre-bonded. After pre-bonding the semiconductor dies 100 onto the semiconductor dies 200, a hybrid bonding step is performed. The hybrid bonding step may include a thermal treatment for dielectric bonding and a thermal annealing for conductor bonding. In some embodiments, the thermal treatment for dielectric bonding is performed to strengthen the bonding between the dielectric bonding layer 172 and the dielectric bonding layer 272. After performing the thermal treatment for dielectric bonding, the thermal annealing for conductor bonding is performed to facilitate the bonding between the bonding pads 174 and 274. In some embodiments, the process temperature of the thermal annealing for conductor bonding is higher than that of the thermal treatment for dielectric bonding. After performing the thermal annealing for conductor bonding, the dielectric bonding layer 172 is bonded to the dielectric bonding layer 272, and the bonding pads 174 are bonded to the underlying bonding pads 274. As such, the upper dies (e.g., the semiconductor die 100) are hybrid bonded to the semiconductor dies 200.

Figure 3B:
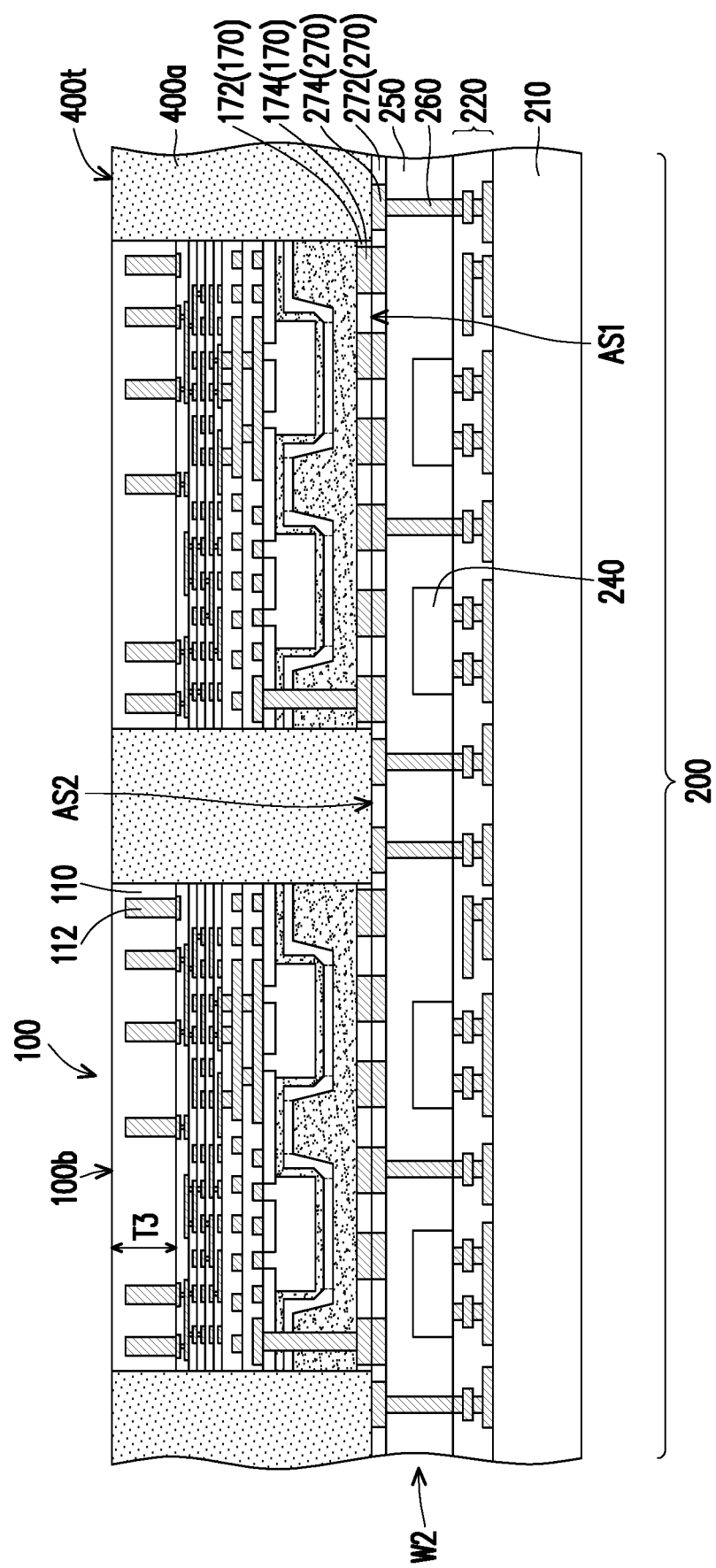

Referring to FIG. 3B, a filling process is performed to form a precursor encapsulant 400a over the semiconductor wafer W2 to encapsulate the semiconductor dies 100. In some embodiments, the precursor encapsulant 400a may be formed so as to fill gaps between the semiconductor dies 100 over the semiconductor wafer W2. In some embodiments, the precursor encapsulant 400a may be formed to be substantially level with the backside surfaces 100b of the semiconductor dies 100. That is, the top surface 400t of the encapsulant may be at substantially the same level height as the backside surfaces 100b. However, the disclosure is not limited thereto. In some alternative embodiments, the precursor encapsulant 400a may cover the backside surfaces 110b of the semiconductor dies 100. In some embodiments, a material of the precursor encapsulant 400a includes inorganic materials such as silicon oxide, silicon nitride, or the like. In some alternative embodiments, a material of the precursor encapsulant 400a includes a molding compound, a polymeric material, such as polyimide, epoxy resin, acrylic resin, phenol resin, BCB, PBO, a combination thereof, or other suitable polymer-based dielectric materials. In some embodiments, the precursor encapsulant 400a may be formed by suitable processes, such as CVD, plasma-enhanced chemical vapor deposition (PECVD), atomic layer deposition (ALD), or the like.

Figure 3C:
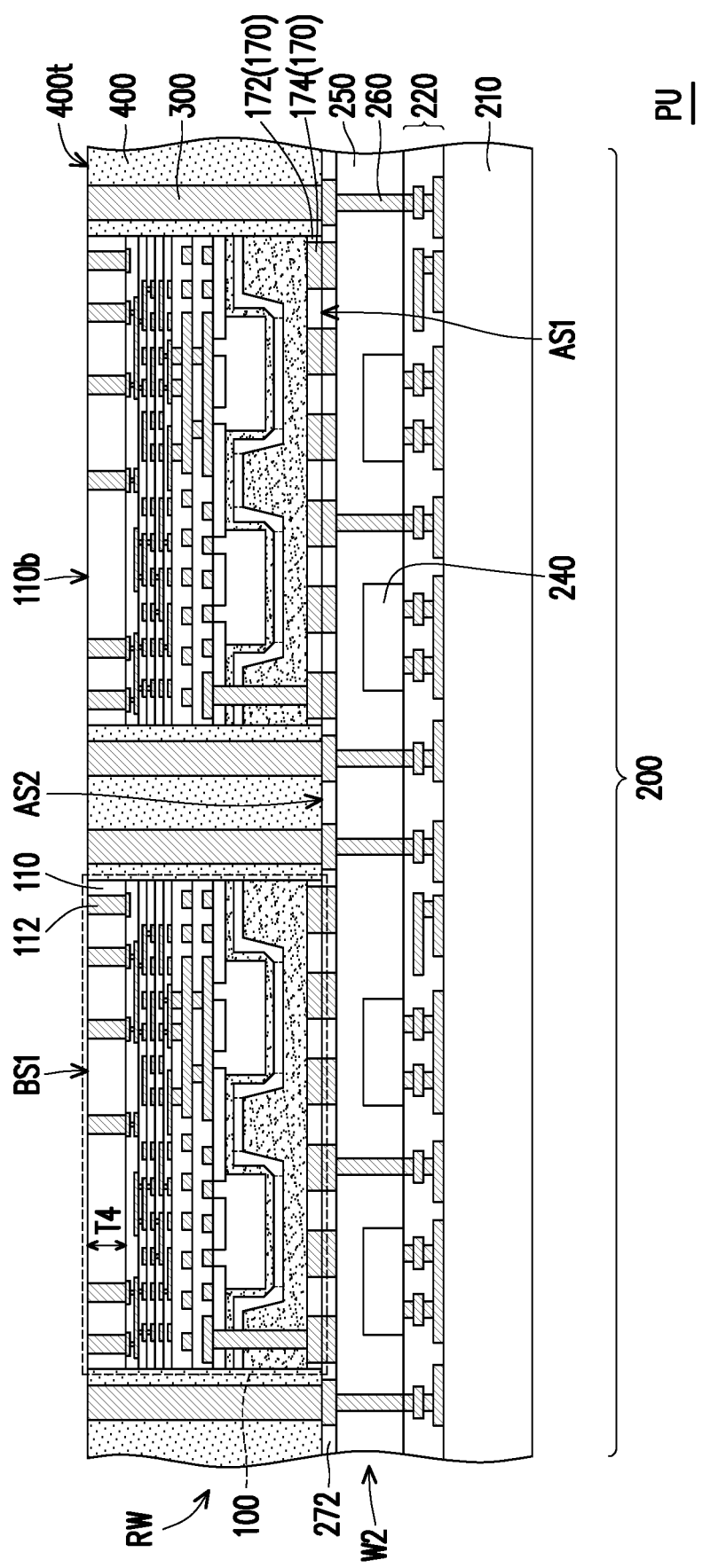

Referring to FIG. 3B and FIG. 3C, in some embodiments, a plurality of conductive vias 300 are formed in the precursor encapsulant 400a besides the semiconductor dies 100. In some embodiments, the conductive vias 300 are formed to surround the semiconductor dies 100 and are attached to the bonding pads 274 not covered by the semiconductor dies 100. In some embodiments, a plurality of openings (not shown) may be formed in the precursor encapsulant 400a to expose some of the bonding pads 274. Subsequently, a conductive material is filled into the openings. In some embodiments, after filling the conductive material in the openings, a planarization process may be performed to planarize the precursor encapsulant 400a and the conductive material, so as to form the encapsulant 400 and the conductive vias 300. In some embodiments, the planarization of the encapsulant 400 includes performing a mechanical grinding process and/or a chemical mechanical polishing (CMP) process. As illustrated in FIG. 3C, the conductive vias 300 are directly in contact with the bonding pads 274. In some embodiments, the conductive vias 300 are electrically connected to the interconnection structure 220 by bonding vias 260 disposed below the bonding pads 274 on which the conductive vias 300 are formed. In some embodiments, during the planarization process of the precursor encapsulant 400a and the conductive material, the semiconductor substrate 110 of the semiconductor dies 100 is thinned from an original thickness T3 (shown in FIG. 3B) to a final thickness T4 (shown in FIG. 3C) until the TSVs 112 are exposed. In some embodiments, the thinning of the semiconductor substrates 110 is achieved by performing the planarization process on the backside surfaces BS1. In some embodiments, portions of the conductive vias 300 and the TSVs 112 may also be removed during the thinning or planarization process. In some embodiments, following the planarization process and the thinning process (if performed), the bottom surface 110b of the semiconductor substrate 110 and the top surface 400t of the encapsulant 400 may be substantially at a same level height (be substantially coplanar). In some embodiments, the conductive vias 300, the TSVs 112, the semiconductor substrate 110, and the encapsulant 400 may substantially reach the same level height. In some embodiments, the conductive vias 300 and the TSVs 112 may slightly protrude with respect to the bottom surfaces 110b of the semiconductor substrate 110 and the top surface 400t of the encapsulant 400. As illustrated in FIG. 3C, the encapsulant 400 laterally encapsulates the semiconductor dies 100 and the conductive vias 300. In some embodiments, the conductive vias 300 penetrate through the encapsulant 400. In some embodiments, the dielectric bonding layer 172 of the semiconductor dies 100 and the dielectric bonding layer 272 of the semiconductor dies 200 are in direct contact with the encapsulant 400. In some embodiments, the dielectric bonding layer 172 is surrounded by the encapsulant 400. With the formation of the encapsulant 400, a reconstructed wafer RW is obtained. In some embodiments, the reconstructed wafer RW includes a plurality of package units PU. In other words, the process may be performed at a reconstructed wafer level, so that multiple package units PU are processed in the form of the reconstructed wafer RW. In FIG. 3C, a single package unit PU is shown for simplicity. However, the disclosure is not limited thereto. Multiple package units PU may be arranged in an array in the reconstructed wafer RW.

Figure 3D:
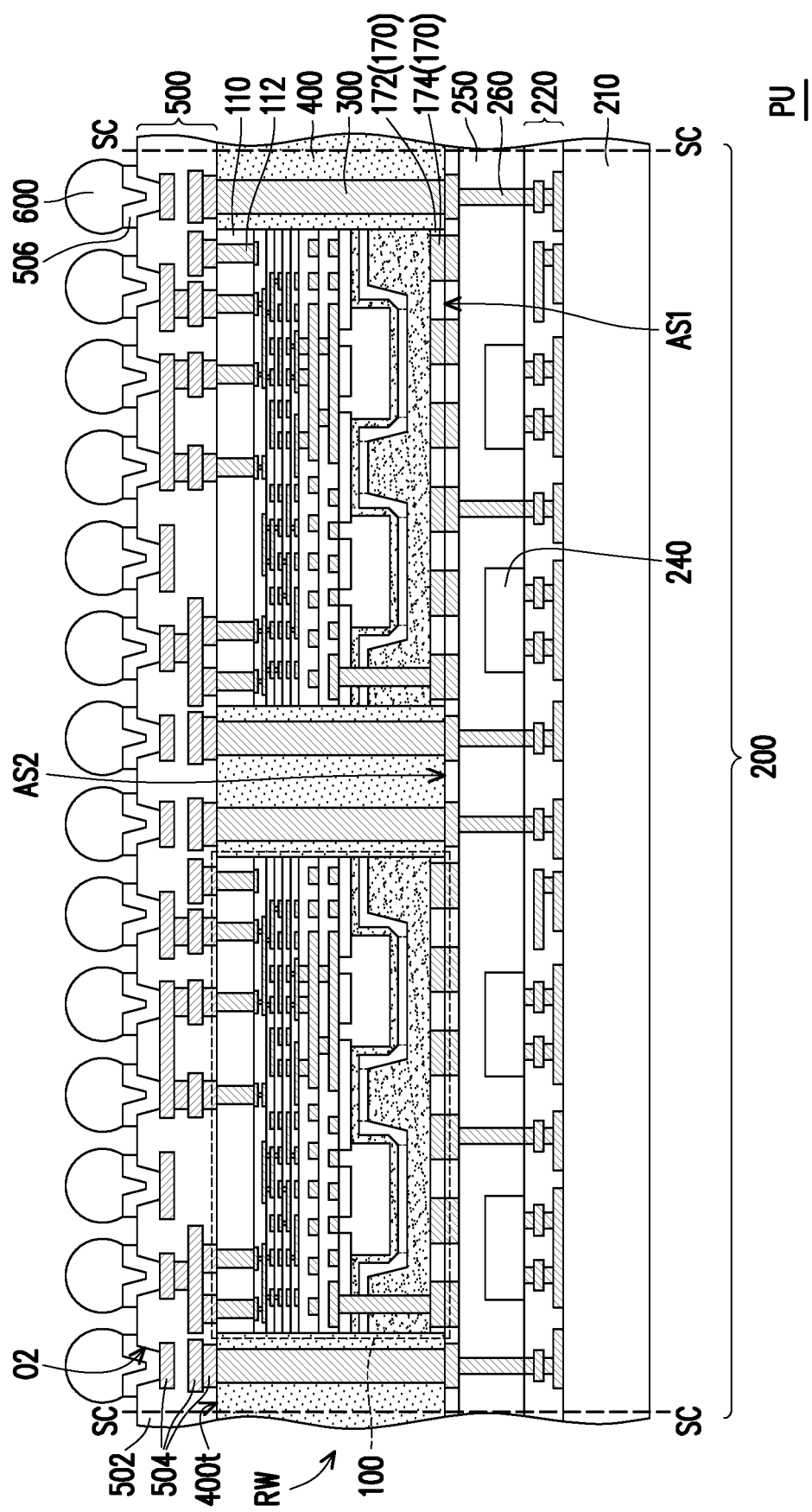

Referring to FIG. 3D, a redistribution structure 500 is formed over the semiconductor dies 100 and the conductive vias 300. In some embodiments, the redistribution structure 500 is disposed over the encapsulant 400. In some embodiments, the redistribution structure 500 includes a dielectric layer 502 and interconnected redistribution conductive layers 504. The redistribution conductive layers 504 may include a plurality of redistribution conductive patterns. For simplicity, the dielectric layer 502 is illustrated as one single dielectric layer and the redistribution conductive layers 504 are illustrated as embedded in the dielectric layer 502 in the drawings. Nevertheless, from the perspective of the manufacturing process, the dielectric layer 502 may include multiple dielectric layers, and each redistribution conductive layer 504 may be sandwiched between two adjacent dielectric layers. Portions of the redistribution conductive layers 504 may extend vertically within the dielectric layer 502 to establish electrical connection with other overlying or underlying redistribution conductive layers 504. In some embodiments, a material of the redistribution conductive layers 504 includes aluminum, titanium, copper, nickel, tungsten, combinations thereof, or other suitable conductive materials. The redistribution conductive layers 504 may be formed by, for example, electroplating, deposition, and/or photolithography and etching. In some embodiments, the material of the dielectric layer 502 includes polyimide, epoxy resin, acrylic resin, phenol resin, benzocyclobutene (BCB), polybenzooxazole (PBO), or any other suitable polymer-based dielectric material. The dielectric layer 502, for example, may be formed by suitable fabrication techniques such as spin-on coating, chemical vapor deposition (CVD), plasma-enhanced chemical vapor deposition (PECVD), or the like. It should be noted that the number of the redistribution conductive layers 504 and the number of the dielectric layers 502 illustrated in FIG. 3D are merely for illustrative purposes, and the disclosure is not limited thereto. In some alternative embodiments, the number of redistribution conductive layers 504 and the number of dielectric layers 502 may be varied depending on the circuit design. In some embodiments, the redistribution conductive layers 504 physically contact the TSVs 112 and the conductive vias 300 to establish electrical connection with the semiconductor dies 100 and 200.

As illustrated in FIG. 3D, a plurality of under-bump metallurgy (UBM) patterns 506 and a plurality of conductive terminals 600 are sequentially formed on the redistribution structure 500. In some embodiments, the UBM patterns 600 may be formed by the following steps. First, a plurality of contact openings O2 is formed in the topmost dielectric layer 502 of the redistribution structure 500. The contact openings O2 at least expose portions of the topmost redistribution conductive layer 504. Then, a seed material layer (not shown) is formed over the topmost dielectric layer 502 and in the contact openings O2. The seed material layer extends into the contact openings O2 to be in direct contact with the exposed portions of the topmost redistribution conductive layer 504. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed UBM patterns 506. For example, the openings of the mask pattern may expose the seed material layer located inside of the contact openings O2 and the seed material layer in proximity of the contact openings O2. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the conductive material layer then constitute the UBM patterns 506. In some embodiments, the UBM patterns 506 are electrically connected to the TSVs 212 and the conductive vias 300 through the redistribution conductive layer 504. As such, the UBM patterns 506 may be electrically connected to the semiconductor dies 100 and 200.

In some embodiments, the conductive terminals 600 are disposed on the UBM patterns 506. In some embodiments, the conductive terminals 600 are attached to the UBM patterns 506 through a solder flux. In some embodiments, the conductive terminals 600 are, for example, solder balls, ball grid array (BGA) balls, or controlled collapse chip connection (C4) bumps. In some embodiments, the conductive terminals 600 include a conductive material with low resistivity, such as Sn, Pb, Ag, Cu, Ni, Bi, or an alloy thereof.

Figure 3E:
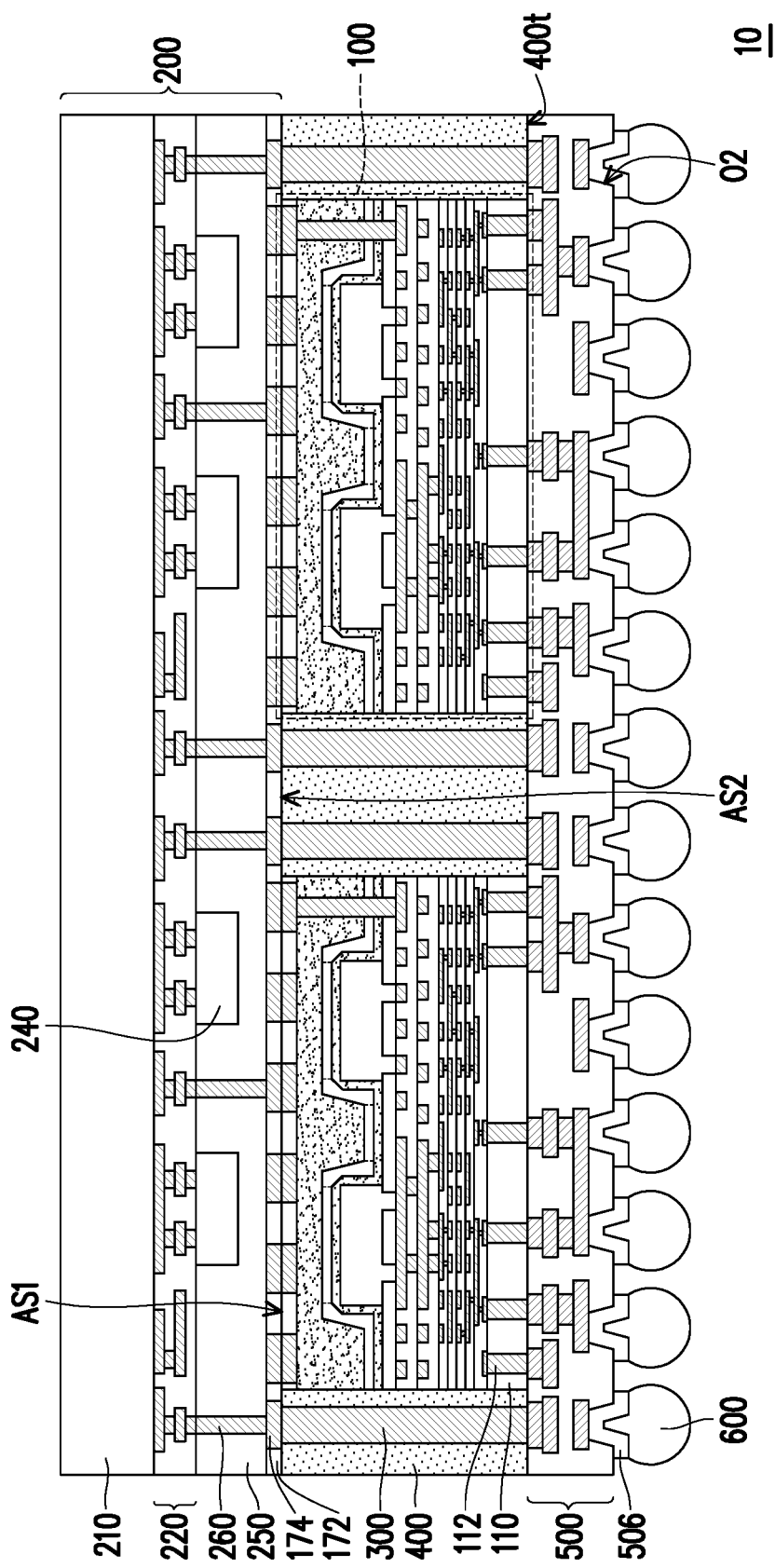

Referring to FIGS. 3D and 3E, a singulation process is performed to form a plurality of semiconductor packages 10. The singulation step is performed to separate the individual semiconductor packages 10, for example, by cutting through the reconstructed wafer RW along the scribe lines SC arranged between individual package units PU. In some embodiments, the dicing process or the singulation process typically involves dicing with a rotating blade or a laser beam. In other words, the dicing or singulation process is, for example, a laser cutting process, a mechanical cutting process, or other suitable processes.

It should be noted that although the semiconductor dies 100 and 200 are shown as hybrid bonded in FIG. 3A to 3E, the disclosure is not limited thereto. In some alternative embodiments, the semiconductor dies 100 and 200 may be interconnected via a different interconnection schemes (e.g., flip-chip bonded to a redistribution structure or the like). In these embodiments, the configurations of the bonding layers 170 and 270 in the semiconductor dies 100 and 200 may be altered for other suitable bonding structures.

In some embodiments, the steps illustrated in FIG. 3A to FIG. 3E may be referred to as "chip on wafer (CoW) level packaging." As illustrated in FIG. 3E, the semiconductor dies 100 are stacked on the semiconductor die 200. In other words, multiple semiconductor dies 100, 200 are integrated into a single semiconductor package 10. As such, the semiconductor package 10 may be referred to as a "system on integrated circuit (SOIC) package." In some embodiments, by adapting the steps presented in FIG. 3A to FIG. 3E, heterogeneous or homogenous semiconductor components may be effectively integrated into a single semiconductor package with lower cost. For example, known-good-dies may be effectively integrated with a semiconductor wafer or another semiconductor die at a low cost. Furthermore, since the conductive terminals 600 are electrically connected to the semiconductor dies 100 and the semiconductor die 200 respectively through the TSVs 112 and the conductive vias 300, shorter electrical paths may be adapted. That is, the signal transmission performance of the semiconductor package 10 may be effectively enhanced.

Figure 3F:
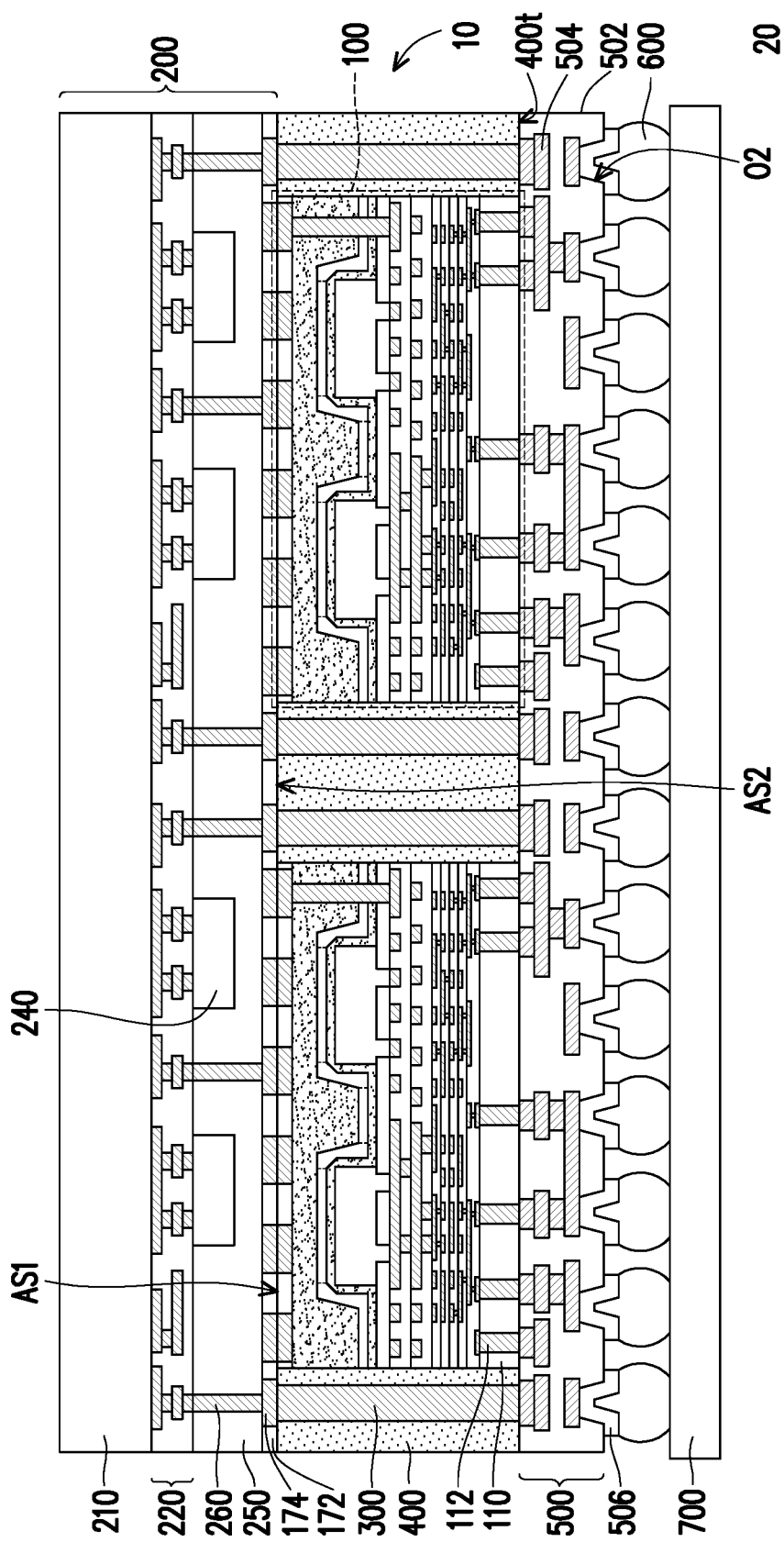
FIG. 3F is a schematic cross-sectional view illustrating an electronic device in accordance with some embodiments of the disclosure.

FIG. 3F is a schematic cross-sectional view illustrating an electronic device in accordance with some embodiments of the disclosure. Referring to FIG. 3F, in some embodiments, the semiconductor package 10 may be stacked on a circuit substrate 700 to form an electronic device 20. In some the circuit substrate 700 may be a motherboard, a printed circuit board, or the like. In some embodiments, the semiconductor package 10 is connected to the circuit substrate 700 through the conductive terminals 600.

Figure 4A:
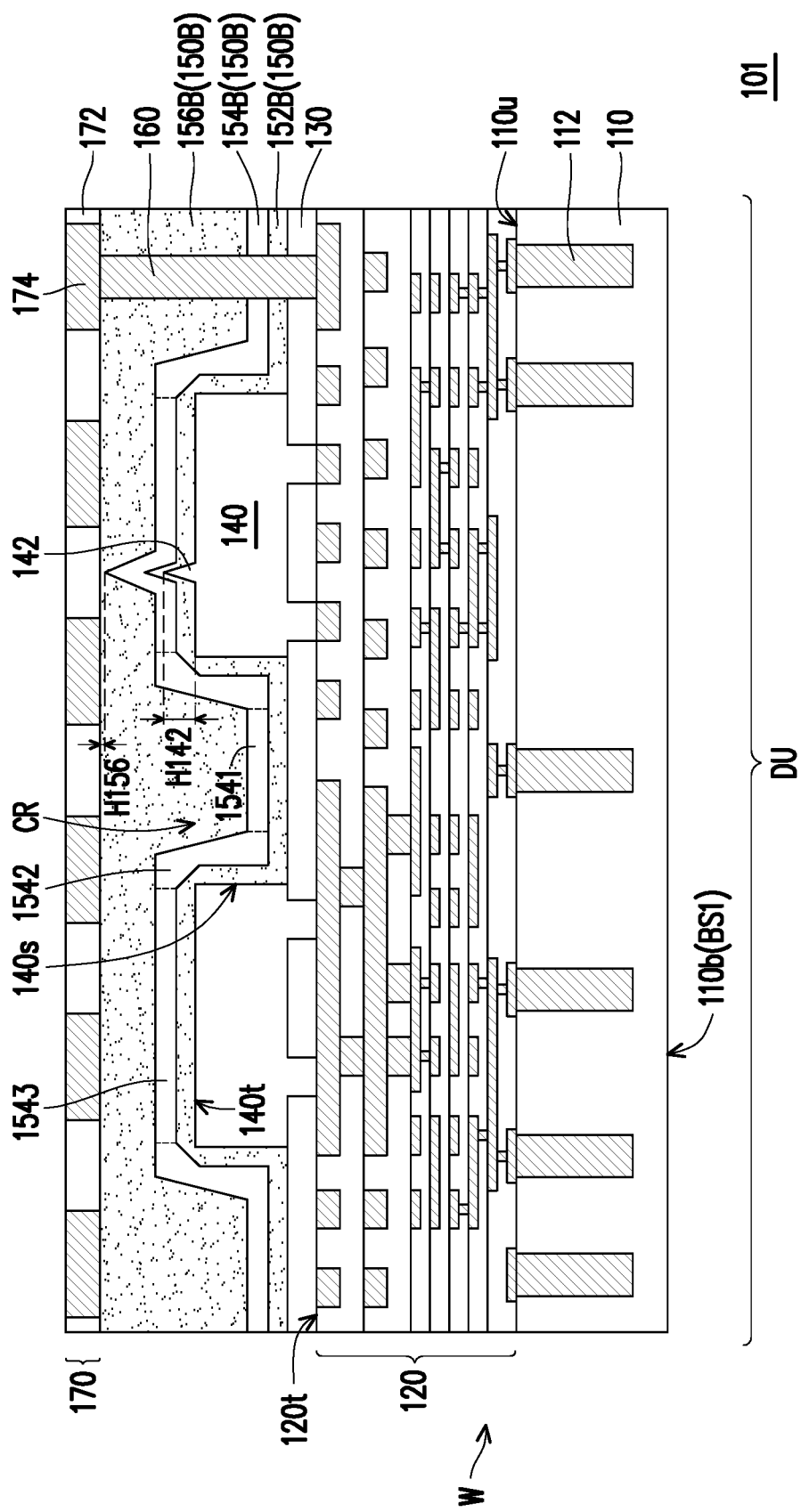
FIG. 4A to FIG. 4C are schematic cross-sectional views illustrating semiconductor dies in accordance with some alternative embodiments of the disclosure.
Figure 4B:
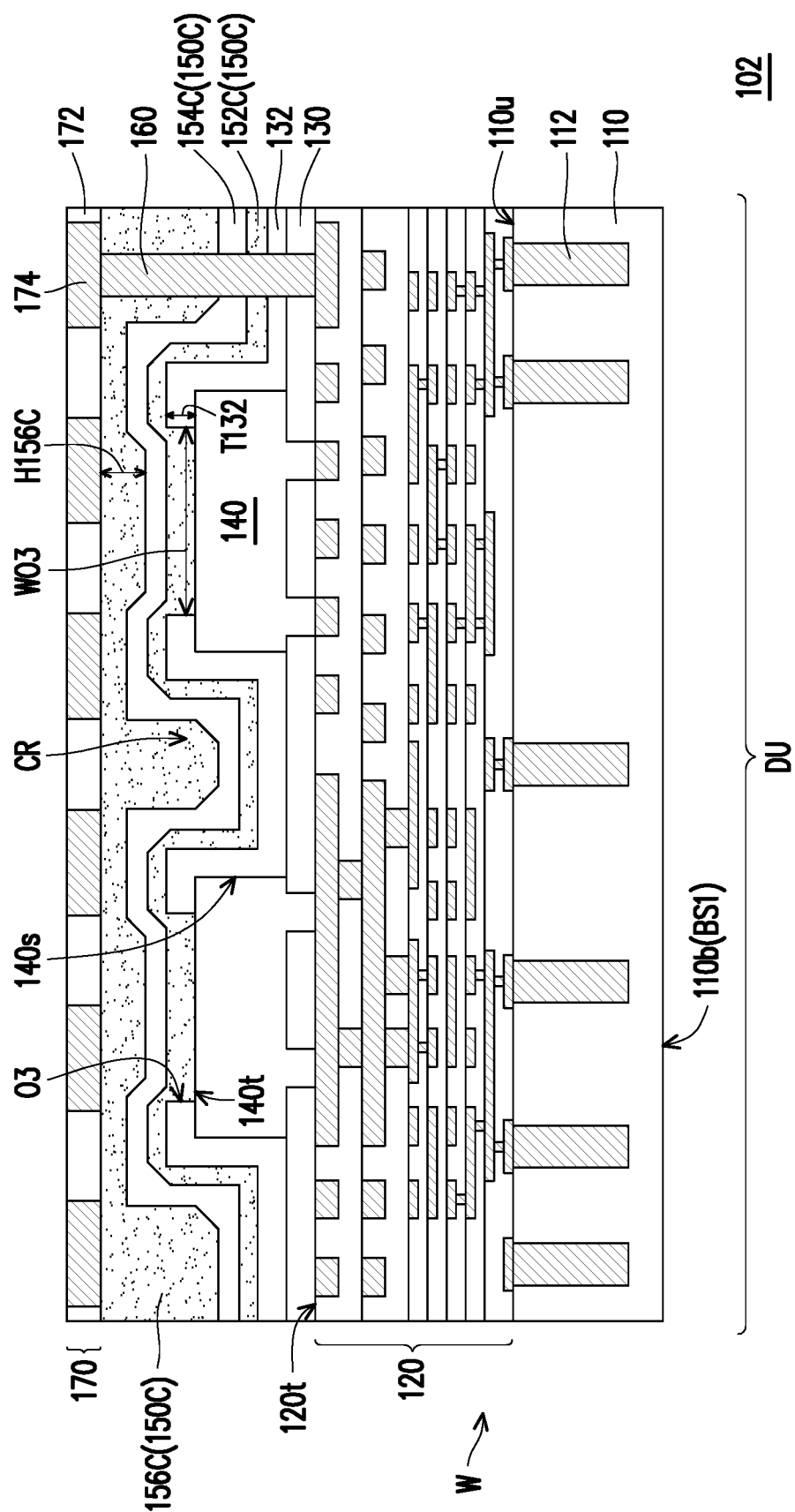
Figure 4C:
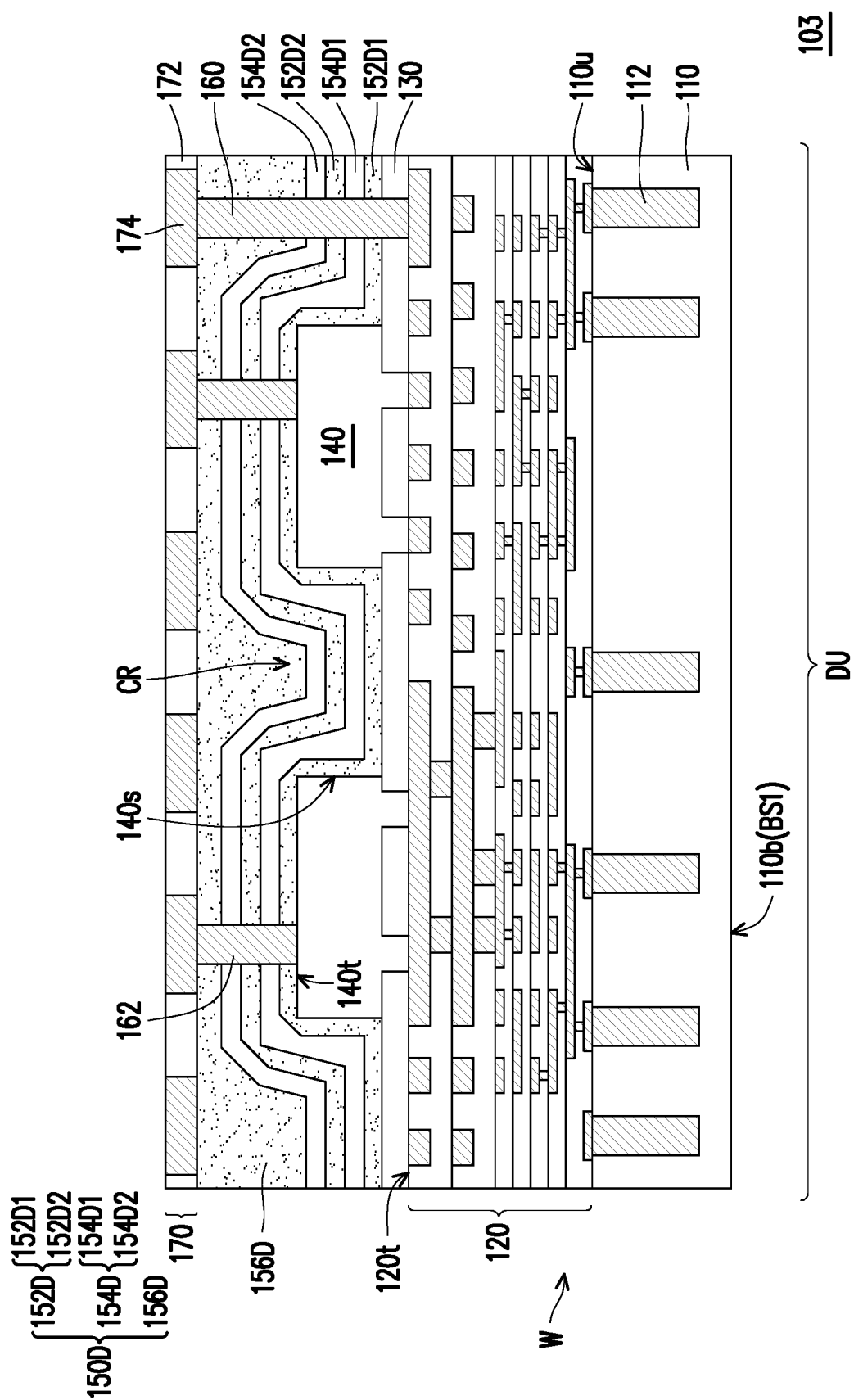

FIG. 4A to FIG. 4C are schematic cross-sectional views illustrating semiconductor dies 101-103 in accordance with some alternative embodiments of the disclosure. Referring to FIG. 4A, the semiconductor die 101 of FIG. 4A may contain similar components as that of the semiconductor die 100 of FIG. 1G, so the same or similar reference numerals are used to indicate analogous components. A difference between the semiconductor die 101 and the semiconductor die 100 is that on at least one of the conductive pads 140B, a probe mark 142 is formed during testing of the semiconductor die 101. That is, before forming the composite passivation structure 150B, a wafer testing operation (sometimes referred to as wafer final test or circuit probing) was performed, for example, to identify known good dies. The testing procedure resulted in formations of probe marks 142 over the conductive pads 140B used for testing. A height H142 of the probe mark 142 may be in the range between 0.5 micrometers and 1 micrometer.

In some embodiments, a profile of the first passivation layers 152B and the second passivation layer 154B formed over the conductive pads 140B may be affected by the presence of the probe mark 142. That is, the first passivation layer 152B and the second passivation layer 154B may present vertical protrusions corresponding to the position of the probe mark 140. That is, the first passivation layer 152B and the second passivation layer 154B respectively have a peak isomorphic with and over the probe mark 142. In some embodiments, to ensure planarity of the bonding layer 170, the third passivation layer 156B has at least a thickness H156 on top of the second passivation layer 154 in correspondence of the probe mark 142. The thickness H156 may be measured as a distance between opposite outer surfaces of the third passivation layer 156 on top of the probe mark 142. A height H142 of the probe mark 142 may be a protruding height of the probe mark 142 with respect to a top surface 140t of the conductive pad 140. A ratio of the thickness H156 to the height H142 may be in the range from 1.5 to 6. In some embodiments, when the thickness H156 of the third passivation layer 156B on top of the probe mark 142 is equal to or greater than 0.3 micrometers, satisfactory planarity of the bonding layer 170 can be achieved, as well as good gap filling capability in the concave region CR adjacent to where the probe mark 142 is formed.

Referring to FIG. 4B, the semiconductor die 102 of FIG. 4B may contain similar components as that of the semiconductor die 100 of FIG. 1G, so the same or similar reference numerals are used to indicate analogous components. A difference between the semiconductor die 102 and the semiconductor die 100 is that a protective layer 132 is formed over the protective layer 130 in the semiconductor die 102. In some embodiments, the protective layer 132 extends over the conductive pads 140. That is, the conductive pads 140 is sandwiched between portions of the protective layer 132 and portions of the protective layer 130. When the protective layer 132 extends above the conductive pads 140, the protective layer 132 includes openings O3 exposing at least a portion of each conductive pad 140. That is, the protective layer 132 covers the side surfaces 140S of the conductive pads 140 and a portion of the top surfaces 140t. In some embodiments, the profiles of the first passivation layer 152C and the second passivation layer 154C formed over the protective layer 132 may present depressions in correspondence of the openings O3. That is, a top surface of the first passivation layer 152C over the protective layer 132 is located at a level height higher than the top surface of the first passivation layer 152C over the openings O3. In some embodiments, a ratio of the width WO3 of the openings O3 to the thickness T132 of the protective layer 132 is equal to or greater than 20. For example, the width WO3 of the openings O3 may be greater than 30 micrometers while the thickness T132 of the protective layer 132 may range between 0.7 micrometers and 1.5 micrometers. When the ratio WO3/T132 falls in said range, optimal gap filling capability can be ensured for the subsequently formed passivation layers 152C, 154C, 156 C. The thickness T132 is taken as the distance (in a vertical direction) between opposite surfaces of the second protective layer 132 on top of the conductive pad 140. The width WO3 is taken as the distance (in a horizontal direction) between two facing surfaces of the protective layer 132 on top of the conductive pads 140. In some embodiments, a ratio of a thickness H156C of the third passivation layer 156C above the openings O3 to the thickness T132 of the protective layer 132 on top of the conductive pad is in the range from 0.2 to 4.3, so as to ensure planarity of the bonding layer 170. For example, the thickness H156C may range between 0.3 micrometers and 3 micrometers while the thickness T132 may range between 0.7 micrometers and 1.5 micrometers. In some embodiments, the thickness H156C is measured as the distance between opposite surfaces of the third passivation layer 156 extending above a given opening O3.

In some embodiments, the protective layer 132 may be formed with similar materials and processes as described for the protective layer 130. In some embodiments, both the protective layer 130 and the protective layer 132 may present a multilayered structure, with layers of different materials stacked on top of each other. For examples, the protective layer 130 and the protective layer 132 may both include stacked layers (not shown) of a first material and a second material. In these embodiments, the contacting layers of the protective layer 130 and the protective layer 132 may be made of the same material. For example, if each of the protective layer 130 and the protective layer 132 includes one layer of a first material and one layer of a second material, the two layers of a second material may be disposed adjacent to each other, in a sequence first material-second material-second material-first material. For example, if the first material is silicon oxide and the second material is silicon nitride, the protective layer 130 may include one first layer of silicon oxide disposed directly on top of the interconnection structure 120, and one first layer of silicon nitride disposed on top of the first layer of silicon oxide. On the other hand, the protective layer 132 would include one second layer of silicon nitride disposed on the first layer of silicon nitride, and one second layer of silicon oxide disposed on the second layer of silicon nitride.

Referring to FIG. 4C, the semiconductor die 103 of FIG. 4C may contain similar components as that of the semiconductor die 100 of FIG. 1G, so the same or similar reference numerals are used to indicate analogous components. A difference between the semiconductor die 103 and the semiconductor die 100 is that the first passivation layer 152D includes a first sub-layer 152D1 and a second sub-layer 152D2 and the second passivation layer 154D includes a first sub-layer 154D1 and a second sub-layer 154D2. In some embodiments, the sub-layers are alternately stacked. For example, the first sub-layer 152D1, the first sub-layer 154D1, the second sub-layer 152D1, and the second sub-layer 152D2 are sequentially stacked on each other. In some embodiments, the semiconductor die 103 has passivation layers 152D1 and 152D2 formed, for example, via CVD, alternately stacked with passivation layers 154D1 and 154D2 formed via HDP-CVD. In some embodiments, the presence of additional passivation layers may enhance the gap-filling capability of the fabrication process, reducing the occurrence of defects and increasing the overall yield. In some embodiments, the semiconductor die 103 further includes additional bonding vias 162 electrically connecting the conductive pads 140 to some of the bonding pads 174. That is, in some embodiments, the conductive pads 104 are used to enhance electrical connection of the semiconductor die 103.

In accordance with some embodiments of the disclosure, a semiconductor die includes a semiconductor substrate, an interconnection structure, conductive pads, a first passivation layer, and a second passivation layer. The interconnection structure is disposed on the semiconductor substrate. The conductive pads are disposed over and electrically connected to the interconnection structure. The first passivation layer and the second passivation layer are sequentially stacked on the conductive pads. The first passivation layer and the second passivation layer fill a gap between two adjacent conductive pads. The first passivation layer includes a first section and a second section. The first section extends substantially parallel to a top surface of the interconnection structure. The second section faces a side surface of one of the conductive pads. Thicknesses of the first section and the second section are different.

In accordance with some embodiments of the disclosure, a semiconductor package includes a first semiconductor die and a second semiconductor die. The first semiconductor die includes a semiconductor substrate, an interconnection structure, conductive pads, and a composite passivation structure. The interconnection structure is disposed on the semiconductor substrate. The conductive pads are disposed beside each other on the interconnection structure. The composite passivation structure covers the conductive pads. The composite passivation structure includes a first passivation layer, a second passivation layer, and a third passivation layer. The first passivation layer is conformally disposed over the conductive pads. The second passivation layer is disposed on the first passivation layer. The second passivation layer has a first section and second sections connected to the first section. The first section and the second sections are located between two adjacent conductive pads. An extending direction of the first section is substantially parallel to a top surface of the interconnection structure. Extending directions of the second sections converge toward the top surface of the interconnection structure. The third passivation layer covers the second passivation layer. The second semiconductor die is disposed on and electrically connected to the first semiconductor die.

In accordance with some embodiments of the disclosure, a manufacturing method of a semiconductor die includes at least the following steps. A semiconductor wafer is provided. The semiconductor wafer has an interconnection structure and conductive pads. A composite passivation structure is formed on the semiconductor wafer to fill in a gap between two adjacent conductive pads. The composite passivation structure is formed by alternating high-density plasma chemical vapor deposition processes with chemical vapor deposition processes. A bonding layer is formed over the composite passivation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
a semiconductor substrate;
an interconnection structure disposed on the semiconductor substrate;
conductive pads disposed over and electrically connected to the interconnection structure; and
a first passivation layer and a second passivation layer sequentially stacked on the conductive pads, wherein the first passivation layer and the second passivation layer fill a gap between two adjacent conductive pads, and the first passivation layer comprises:
a first section extending substantially parallel to a top surface of the interconnection structure; and
a second section facing a side surface of one of the conductive pads, and thicknesses of the first section and the second section are different.

2. The semiconductor die of claim 1, further comprising a protective layer disposed between the interconnection structure and the first passivation layer and between portions of the conductive pads and the first passivation layer, wherein the protective layer has openings partially exposing the top surfaces of the conductive pads.

3. The semiconductor die of claim 2, wherein a top surface of the first passivation layer over the protective layer is located at a level higher than the top surface of the first passivation layer over the openings.

4. The semiconductor die of claim 3, wherein a ratio of a thickness of the second passivation layer above one of the openings to a thickness of the protective layer ranges between 0.2 and 4.3.

5. The semiconductor die of claim 1, wherein the first passivation layer and the second passivation layer are made of a same material.

6. The semiconductor die of claim 1, wherein the first section is thinner than the second section.

7. The semiconductor die of claim 1, wherein a ratio of a distance between two adjacent conductive pads and a height of the conductive pads is less than 3.

8. A semiconductor package, comprising:
a first semiconductor die, comprising:
a semiconductor substrate;
an interconnection structure disposed on the semiconductor substrate;
conductive pads disposed beside each other on the interconnection structure; and
a composite passivation structure covering the conductive pads, comprising:
a first passivation layer conformally disposed over the conductive pads;
a second passivation layer disposed on the first passivation layer, wherein the second passivation layer has a first section and second sections connected to the first section, the first section and the second sections are located between two adjacent conductive pads, an extending direction of the first section is substantially parallel to a top surface of the interconnection structure, and extending directions of the second sections converge toward the top surface of the interconnection structure; and
a third passivation layer covering the second passivation layer; and a second semiconductor die disposed on and electrically connected to the first semiconductor die.

9. The semiconductor package of claim 8, wherein at least one of the contact pads has a probe mark protruding from a top surface of the at least one of the contact pads, and the first passivation layer and the second passivation layer respectively have a peak isomorphic with and over the probe mark.

10. The semiconductor package of claim 9, wherein a ratio between a thickness of the third passivation layer over the probe mark to a protruding height of the probe mark ranges between 1.5 and 6.

11. The semiconductor package of claim 8, wherein an included angle between the first section and one of the second sections ranges between 100° and 120°.

12. The semiconductor package of claim 8, wherein the third passivation layer includes a first portion disposed over the first section of the second passivation layer and second portions respectively disposed over the corresponding second sections of the second passivation layer, and the first portion of the third passivation layer has a triangular shape pointing away from the interconnection structure.

13. The semiconductor package of claim 8, wherein an outer surface of one of the second sections facing away from the conductive pads is substantially straight.

14. The semiconductor package of claim 8, wherein the first semiconductor die has a first bonding layer comprising first bonding pads, the second semiconductor die has a second bonding layer comprising second bonding pads, the first bonding layer is bonded to the second bonding layer, and the first bonding pads are aligned with the corresponding second bonding pads.

15. A manufacturing method of a semiconductor die, comprising:
providing a semiconductor wafer having an interconnection structure and conductive pads;
forming a composite passivation structure on the semiconductor wafer to fill a gap between two adjacent conductive pads, wherein the composite passivation structure is formed by alternating high-density plasma chemical vapor deposition processes with chemical vapor deposition processes; and
forming a bonding layer over the composite passivation structure.

16. The manufacturing method of claim 15, wherein forming the composite passivation structure comprises:
performing a first chemical vapor deposition process to form a first passivation layer on the semiconductor wafer;
performing a high-density plasma chemical vapor deposition process to form a second passivation layer on the first passivation layer; and
performing a second chemical vapor deposition process to form a third passivation layer on the second passivation layer.

17. The manufacturing method of claim 16, wherein during the high-density plasma chemical vapor deposition process, at least a portion of the first passivation layer is removed.

18. The manufacturing method of claim 17, wherein during the high-density plasma chemical vapor deposition process, at least a portion of the second passivation layer is removed.

19. The manufacturing method of claim 15, further comprising forming bonding vias extending through the composite passivation structure to electrically connect the interconnection structure and the bonding layer.

20. The manufacturing method of claim 15, further comprising forming a protective layer over the interconnection structure and the conductive pads before forming the composite passivation structure.

* * * * *